(12) United States Patent
Cho et al.

(10) Patent No.: US 8,030,697 B2
(45) Date of Patent: Oct. 4, 2011

(54) CELL STRUCTURE OF SEMICONDUCTOR DEVICE HAVING AN ACTIVE REGION WITH A CONCAVE PORTION

(75) Inventors: Min-Hee Cho, Suwon-si (KR); Seung-Bae Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 109 days.

(21) Appl. No.: 12/489,757

(22) Filed: Jun. 23, 2009

(65) Prior Publication Data
US 2009/0261422 A1 Oct. 22, 2009

Related U.S. Application Data

(63) Continuation-in-part of application No. 12/211,412, filed on Sep. 16, 2008.

(30) Foreign Application Priority Data

Sep. 18, 2007 (KR) .................. 10-2007-0094723

(51) Int. Cl.
*H01L 27/108* (2006.01)
*H01L 29/94* (2006.01)

(52) U.S. Cl. ........ 257/306; 257/296; 257/300; 257/301; 257/302; 257/303; 257/304; 257/305; 257/307; 257/308; 257/309; 257/390; 257/905; 257/906; 257/907; 257/908; 257/E21.646; 257/E27.084

(58) Field of Classification Search ........... 257/E21.646, 257/E27.084, 296, 300, 301, 302, 303, 304, 257/305, 306, 307, 308, 309, 905, 906, 907, 908, 390
See application file for complete search history.

(56) References Cited

U.S. PATENT DOCUMENTS

| | | | | | |
|---|---|---|---|---|---|
| 5,014,103 | A | * | 5/1991 | Ema | 257/296 |
| 5,406,102 | A | * | 4/1995 | Oashi | 257/296 |
| 5,732,009 | A | | 3/1998 | Tadaki et al. | |
| 7,057,242 | B2 | * | 6/2006 | Kim et al. | 257/401 |
| 7,183,603 | B2 | | 2/2007 | Park | |
| 2004/0147114 | A1 | * | 7/2004 | Park et al. | 438/666 |
| 2006/0060936 | A1 | * | 3/2006 | Park et al. | 257/510 |
| 2009/0073736 | A1 | | 3/2009 | Cho et al. | |

FOREIGN PATENT DOCUMENTS

| | | |
|---|---|---|
| JP | 08288471 | 11/1996 |
| JP | 09036325 | 2/1997 |
| KR | 19970008613 A | 2/1997 |
| KR | 1020050096595 A | 10/2005 |
| KR | 1020070019134 A | 2/2007 |

* cited by examiner

*Primary Examiner* — Matthew E Warren
*Assistant Examiner* — David Chen
(74) *Attorney, Agent, or Firm* — Volentine & Whitt, PLLC

(57) ABSTRACT

A cell structure of a semiconductor device includes an active region, having a concave portion, and an inactive region that defines the active region. A gate pattern in the active region is arranged perpendicular to the active region. A landing pad on the active region and the inactive region contacts the active region. A bit line pattern on the inactive region intersects the gate pattern perpendicularly, the bit line pattern being electrically connected to the landing pad and having a first protrusion corresponding to the concave portion of the active region.

11 Claims, 26 Drawing Sheets

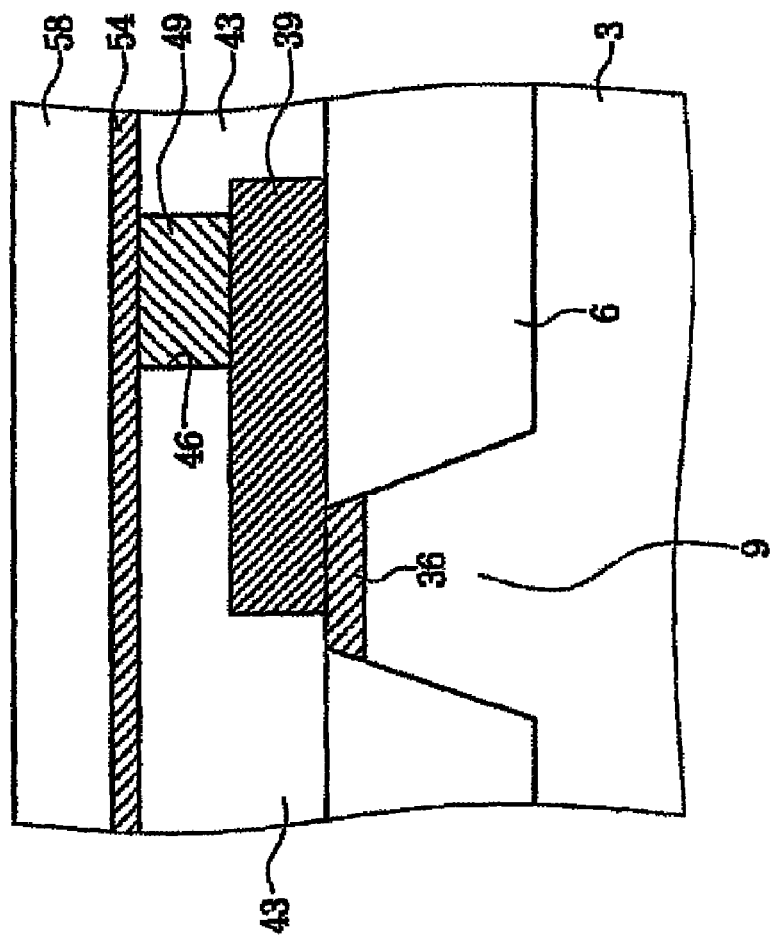

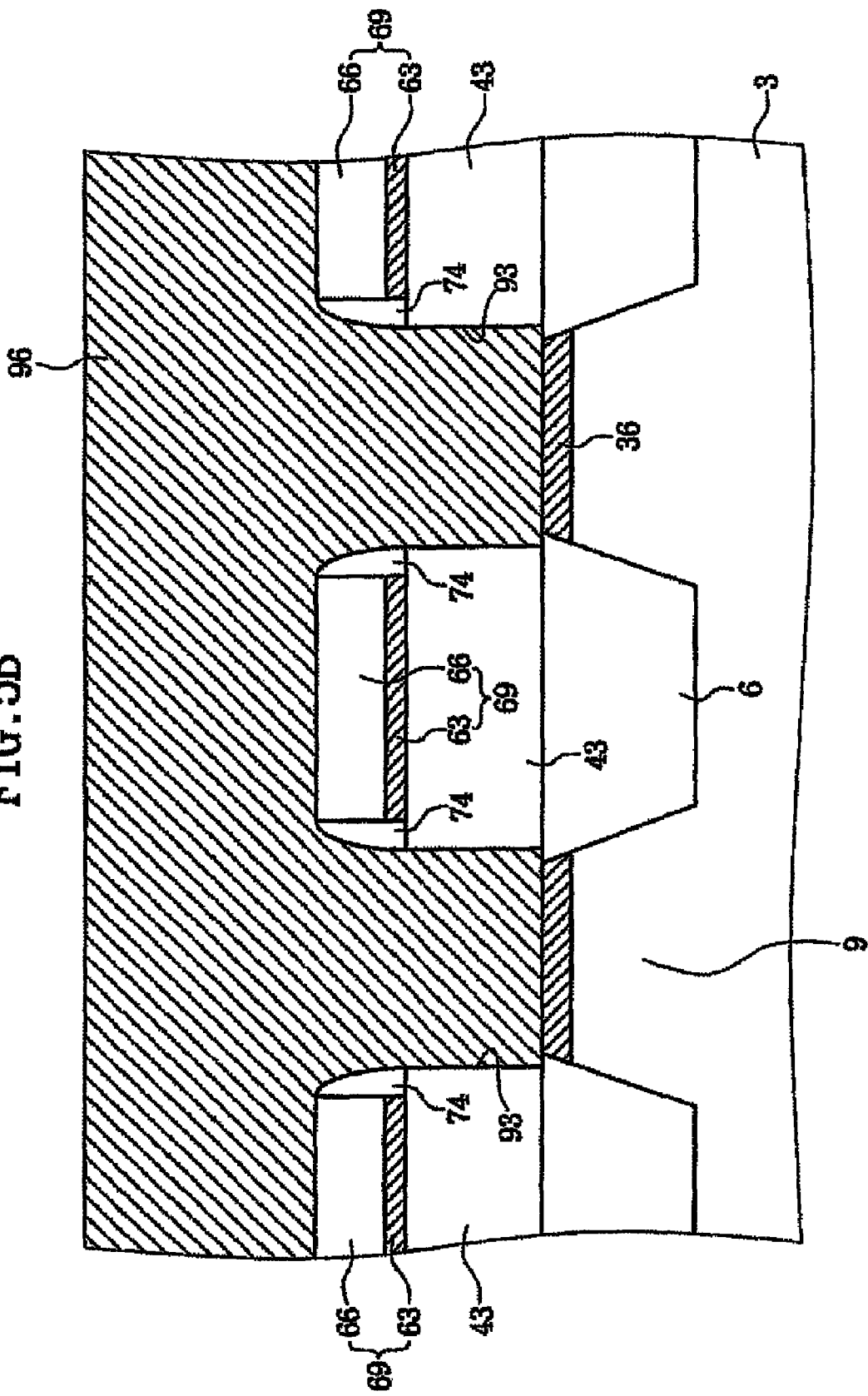

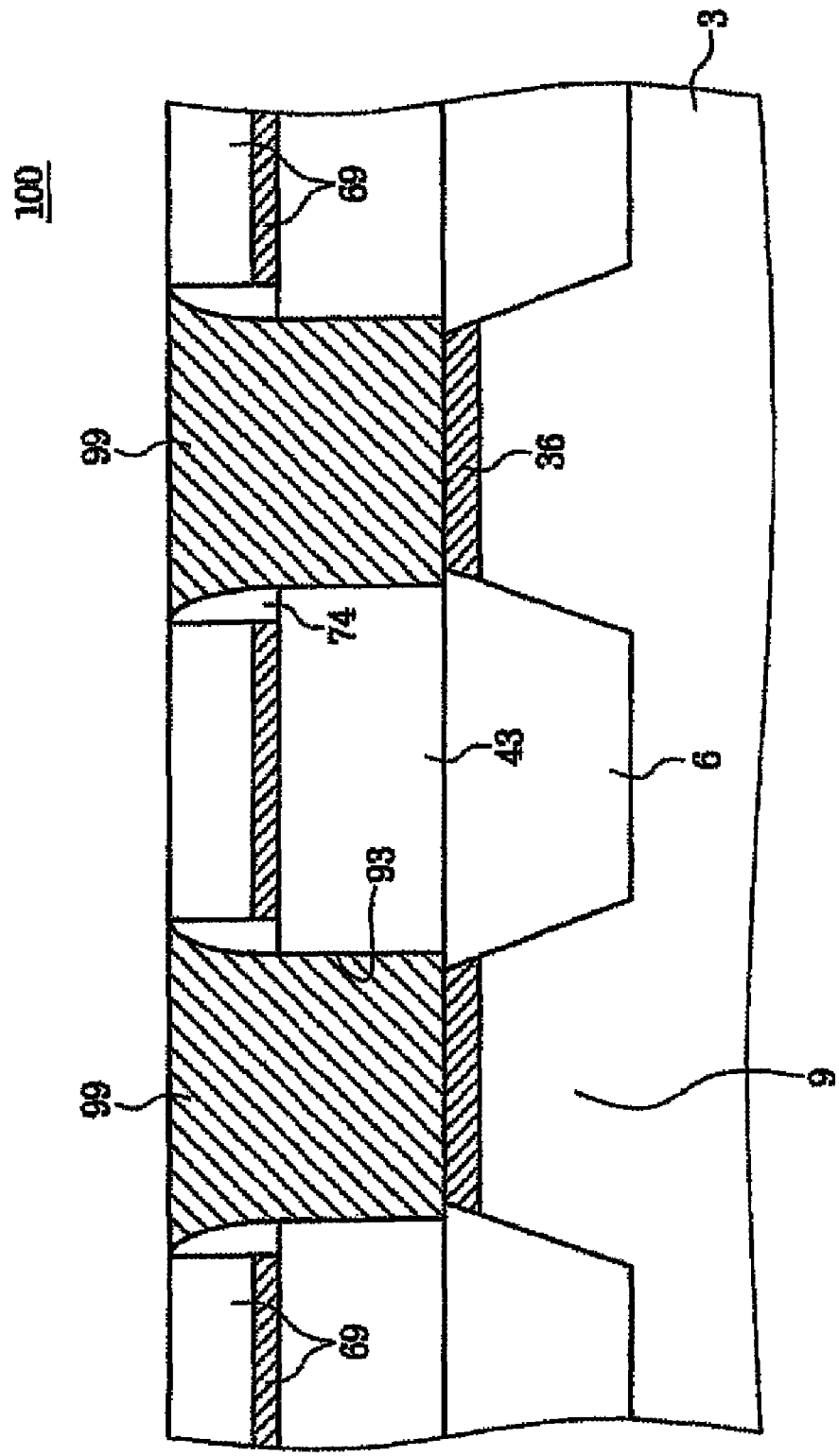

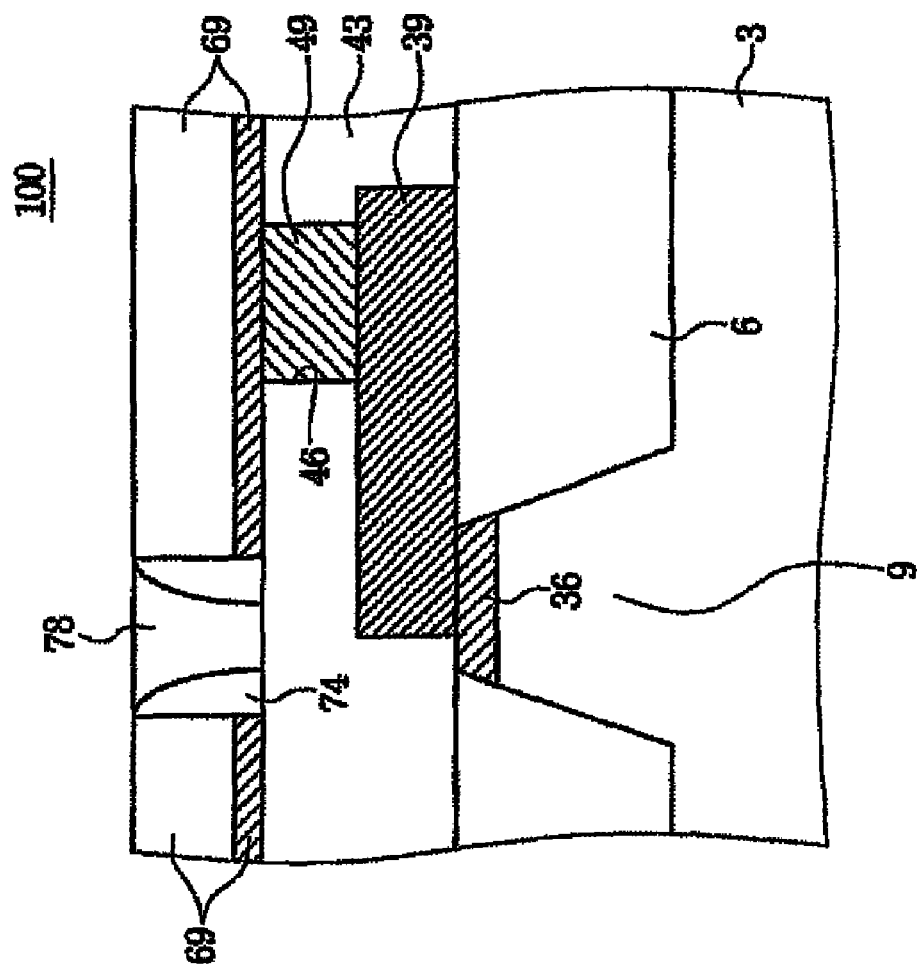

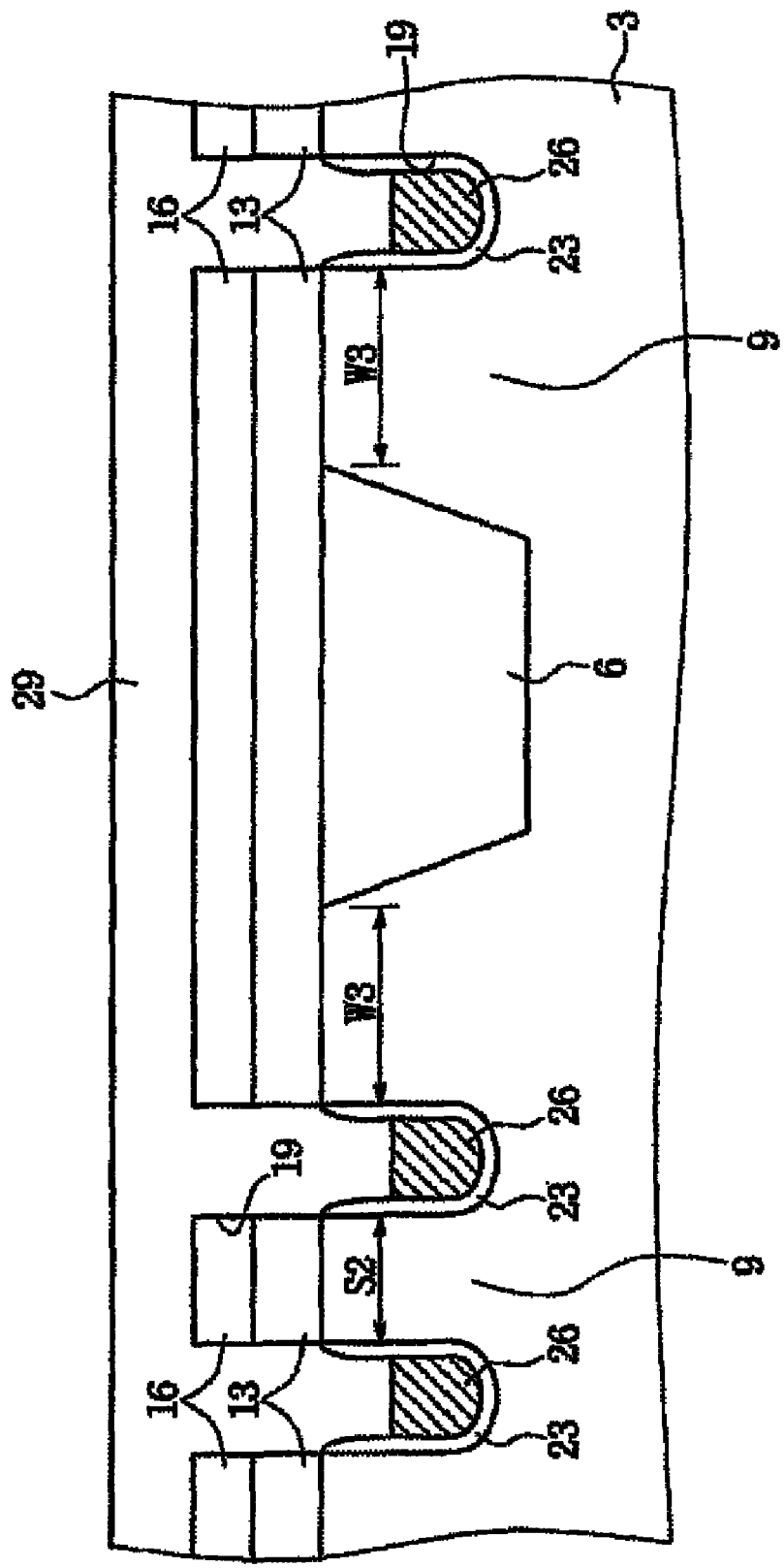

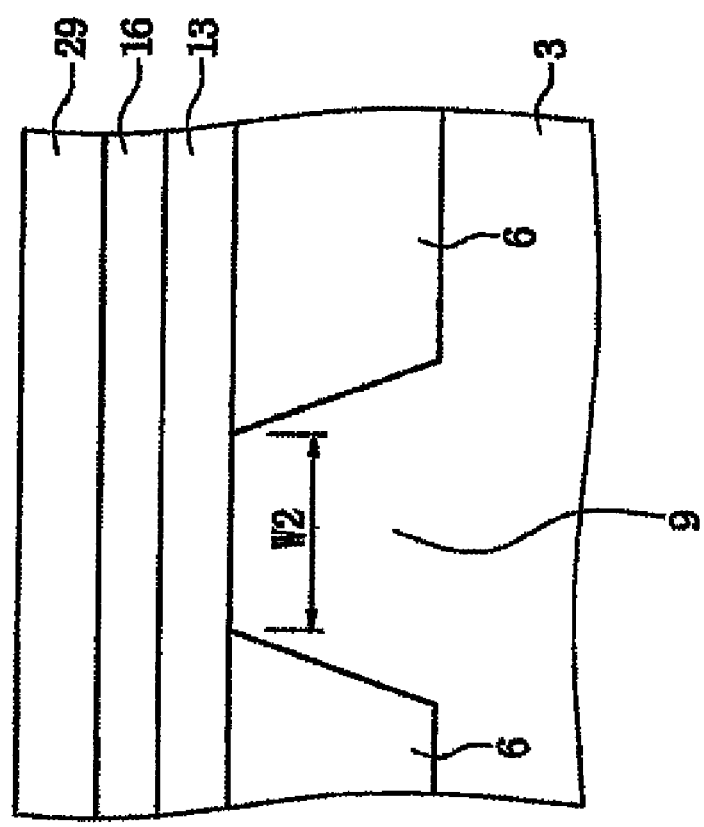

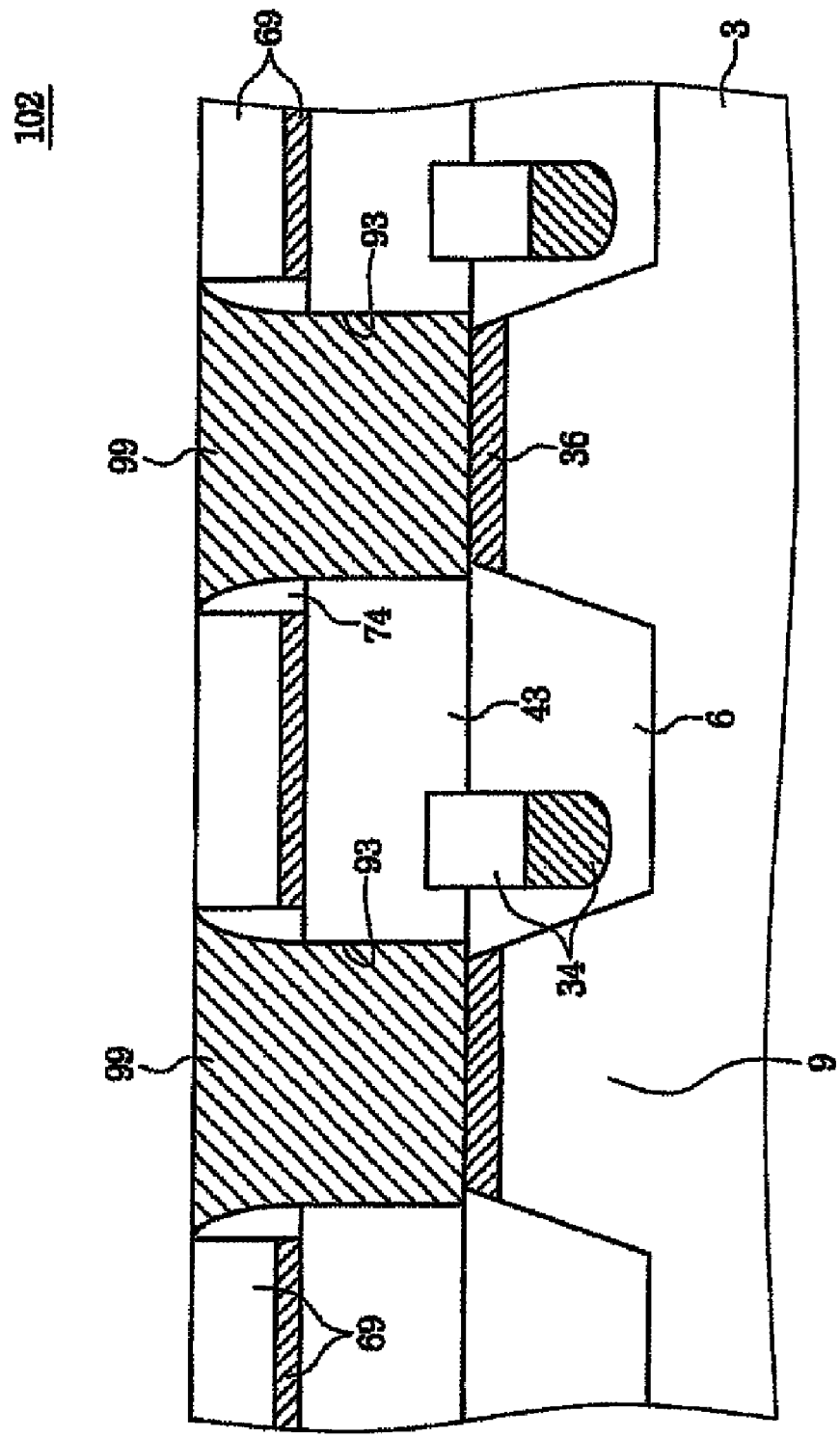

CELL STRUCTURE OF SEMICONDUCTOR DEVICE HAVING AN ACTIVE REGION WITH A CONCAVE PORTION

PRIORITY CLAIM

The present application is a continuation-in-part of United States Patent Application Publication No. 2009/0073736, filed Sep. 16, 2008, which claims priority to Korean Patent Application No. 10-2007-0094723, filed Sep. 18, 2007, in the Korean Intellectual Property Office. The subject matter of all of the above-referenced applications is hereby incorporated by reference.

BACKGROUND

Representative embodiments relate to a semiconductor device, and more particularly, to a cell structure of a semiconductor device.

In general, smaller semiconductor devices are being fabricated in accordance with decreasing design rules and increased integration density. A semiconductor device may include an active region, gate patterns, bit line pattern, storage nodes, and the like. The active region may be arranged in a semiconductor substrate in a direction diagonal to the gate patterns or the bit line pattern in order to increase integration density per unit area and decrease size. However, a diagonal arrangement does not take into consideration the alignment system of a semiconductor photolithography apparatus, which moves horizontally and vertically in rows and columns. In other words, it is difficult to accurately align the gate patterns, the bit line pattern and the storage nodes with the active region. Accordingly, the gate patterns, the bit line pattern, and the storage nodes may not have good electrical characteristics with the active region, and thus deteriorating the semiconductor device.

Illustrative embodiments provide a cell structure of a semiconductor device, which optimizes the arrangement of an active region, a gate pattern and a bit line pattern, for example, increasing the exposed area of the active region between the gate pattern and the bit line pattern.

According to illustrative embodiments, a cell structure of a semiconductor device includes an active region and an inactive region in a semiconductor substrate. The active region has a concave portion, and the inactive region defines the active region. A gate pattern is disposed in the first active region and the inactive region. The gate pattern in the first active region is arranged perpendicular to the first active region. A landing pad on the first active region and the inactive region contacts the active region. A bit line pattern on the inactive region intersects the gate pattern perpendicularly, the bit line pattern being electrically connected to the landing pad and having a first protrusion corresponding to the concave portion of the active region.

The concave portion of the first active region may be in a selected lateral portion of the first active region, which overlaps a portion of the first gate pattern. The first gate pattern may extend across the concave portion of the first active region, and below the first protrusion of the bit line pattern. The first gate pattern may also extend from upper portions of the first active region and the inactive region toward lower portions of the first active region and the inactive region.

The cell structure may further include a bit line contact between the first landing pad and the bit line pattern. The bit line contact contacts the first landing pad and the bit line pattern on the inactive region.

The first protrusion of the bit line pattern may extend from a first lateral portion of the bit line pattern and overlap the concave portion of the first active region.

The cell structure may further include a second active region having the same shape as the first active region, and a second gate pattern in the second active region having the same shape as the first gate pattern. The bit line pattern may have a second protrusion extending from a second lateral portion of the bit line pattern and having the same shape as the first protrusion. The second active region may be arranged horizontally with respect to the first active region along a row of the semiconductor substrate.

The first and second gate patterns may be parallel to each other and extend across the concave portion of the first active region, a concave portion of the second active region, and the first and second protrusions of the bit line pattern.

The second protrusion of the bit line pattern may overlap a lateral portion of the second active region, which is located opposite to the concave portion of the second active region.

The bit line pattern may have third protrusions, having the same shape as the first and second protrusions, positioned repeatedly along the first and second lateral portions of the bit line pattern. Also, the cell structure may further include third active regions corresponding to the third protrusions and arranged along the bit line pattern in the semiconductor substrate, the third active regions having the same shape as the first active region and being positioned vertically and horizontally with respect to the first and second active regions. The cell structure may further include third gate patterns in the third active regions, the third gate patterns having the same shape as the first and second gate patterns, and second landing pads located between the third gate patterns and contacting the third active regions to electrically connect the third active regions to the bit line pattern.

According to other illustrative embodiments, a cell structure of a semiconductor device includes a first active region in a semiconductor substrate, the first active region having first and second lateral portions, and an inactive region in the semiconductor substrate, defining the first active region. First and second gate patterns intersect the first lateral portion of the first active region parallel to one another, separated by a first width in the first active region, and intersect the second lateral portion of the first active region diagonally extending away from one another other over a predetermined distance, and becoming parallel to one another, separated by a second width greater than the first width in the inactive region. A first landing pad is on the first active region and the inactive region is in contact with the first active region, the first landing pad being positioned between the first and second gate patterns. A bit line pattern is on the inactive region and intersects the first and second gate patterns, the bit line pattern having a first protrusion. The bit line pattern is electrically connected to the first landing pad through the first protrusion.

The first active region may overlap the first protrusion of the bit line pattern. The first and second gate patterns may extend below the first protrusion of the bit line pattern. Also, the first and second gate patterns may extend from upper portions of the first active region and the inactive region toward lower portions of first active region and the inactive region.

The cell structure may further include a bit line contact between the first landing pad and the bit line pattern. The bit line contact contacts the first landing pad and the first protrusion.

The first protrusion of the bit line pattern may extend from a first lateral portion of the bit line pattern toward the first active region and contact the bit line contact.

The cell structure may further include second and third active regions having the same shape as the first active region, and positioned diagonally with respect to the first active region in rows of the semiconductor substrate. The first and second gate patterns may be respectively located in the second and third active regions separated by the second width.

The bit line pattern may have second protrusions, having the same shape as the first protrusion, positioned repeatedly along the first lateral portion of the bit line pattern. Also, the cell structure may her include third gate patterns and fourth active regions located along the bit line pattern in the semiconductor substrate to correspond to the second protrusions; and fourth active regions corresponding to the second protrusions and arranged along the bit line pattern in the semiconductor substrate. The fourth active regions may have the same shape as the first through third active regions. The third gate patterns have the same shape as the first and second gate patterns, and the cell structure may further includes second landing pads located between the third gate patterns and contacting the fourth active regions to electrically connect the fourth active regions to the bit line pattern at the second protrusions.

According to still other illustrative embodiments, a cell structure of a semiconductor device includes an active region in a semiconductor substrate and an inactive region defining the active region, the active region having a first lateral portion and a second lateral portion. A first gate pattern intersects the first lateral portion of the active region and is disposed in the active region. A second gate pattern intersects the first lateral portion parallel to the first gate pattern, and intersects the second lateral portion either parallel to the first gate pattern or diagonal to the first gate pattern and then parallel to the first gate pattern in a vicinity of the inactive region. A landing pad is positioned on the active and inactive regions between the first and second gate patterns, the landing pad contacting the active region. A bit line pattern intersects the second gate pattern and electrically connects to the landing pad, the bit line pattern having a protrusion overlapping the active region.

The cell structure may further include a bit line contact between the landing pad and the bit line pattern. The bit line contact is on the inactive region or on the active and inactive regions, and contacts the landing pad and the bit line pattern.

BRIEF DESCRIPTION OF THE DRAWINGS

The embodiments of the present invention will be described with reference to the attached drawings. The drawings are not necessarily to scale, emphasis instead being placed upon illustrating the principles of the illustrative embodiments. It should be understood that various aspects of the drawings may be exaggerated for clarity.

DETAILED DESCRIPTION OF THE EMBODIMENTS

Figure 1:
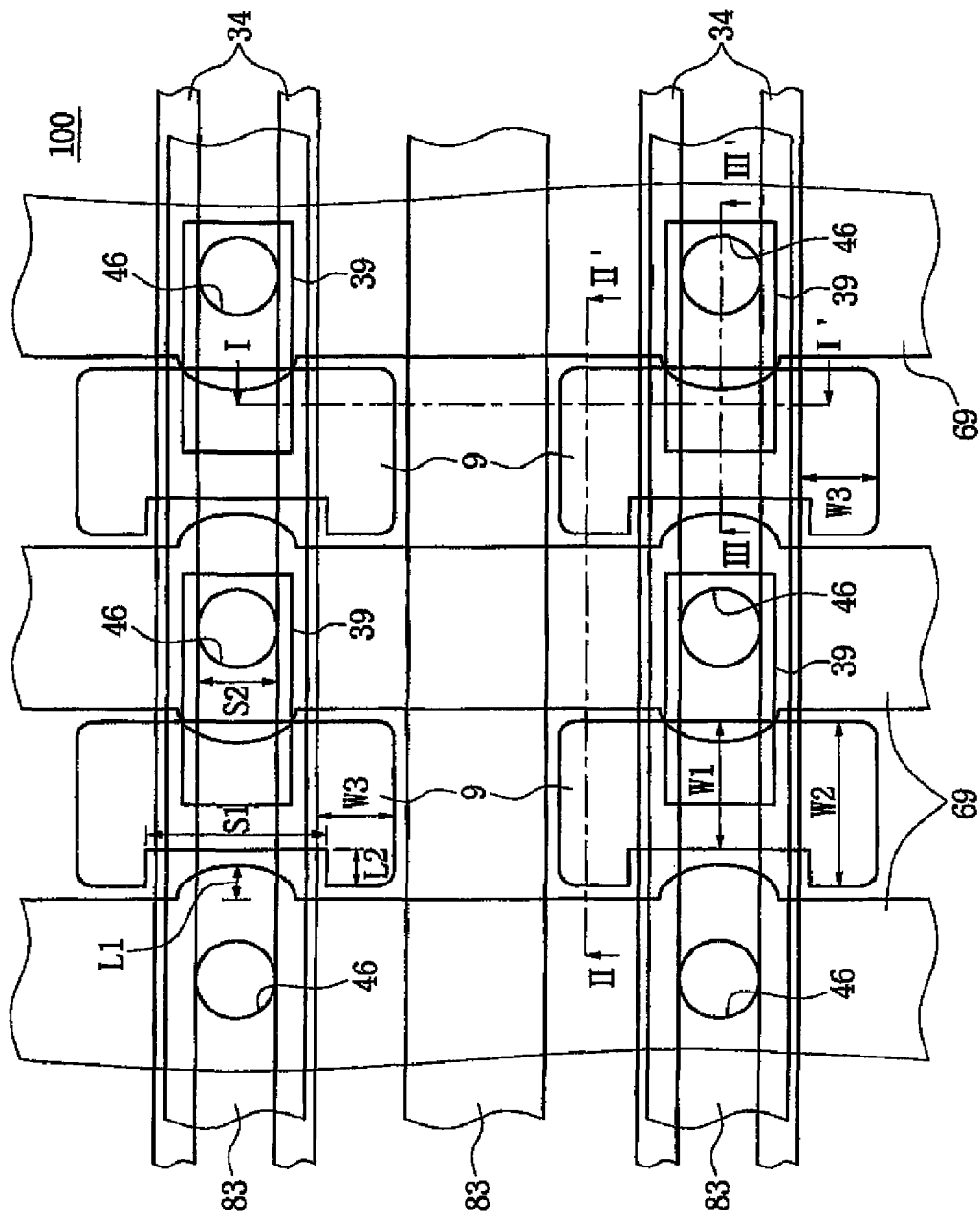
FIG. 1 is a plan view of a cell structure of a semiconductor device, according to illustrative embodiments.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Also, it will be understood that although terms, such as "substrate," "mask," "contact" "pad," "pattern" and the like, are used herein to describe various elements, the elements are not limited by these terms. These terms are only used to distinguish one element from another element.

As used herein, the term "selected one" includes any and all combinations of one or more of the associated listed items. Spatially relative terms, such as "selected," "under," "horizontal," "vertical," "parallel," "diagonal," "other," "peripheral," "on" and the like, may be used for ease of description of element or feature's relationship to another element(s) or feature(s), as illustrated in the figures. The terminology used herein is for the purpose of describing particular embodiments only and is not intended to be limiting of the illustrative embodiments.

Hereinafter, a cell structure of a semiconductor device will be described more fully with reference to the accompanying drawings in which illustrative embodiments are shown.

FIG. 1 is a plan view of a cell structure of a semiconductor device, according to illustrative embodiments, and FIGS. 3A through 6C are various cross-sectional views of FIG. 1 for illustrating a method of fabricating a cell structure of a semiconductor device, according to illustrative embodiments.

Figure 3A:
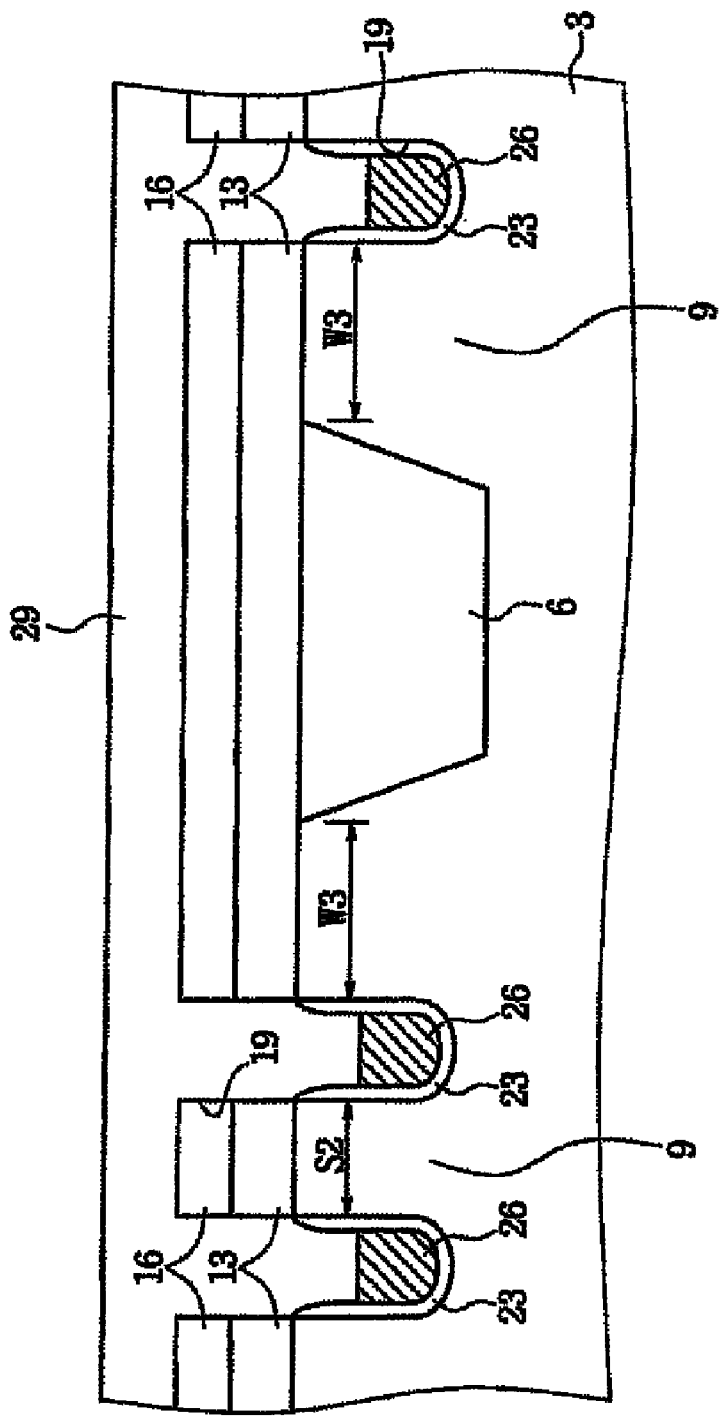
FIGS. 3A through 6C are cross-sectional views taken along lines I-I', II-II', and III-III' of FIG. 1, which illustrate a method of fabricating a cell structure of a semiconductor device, according to illustrative embodiments.
Figure 3B:
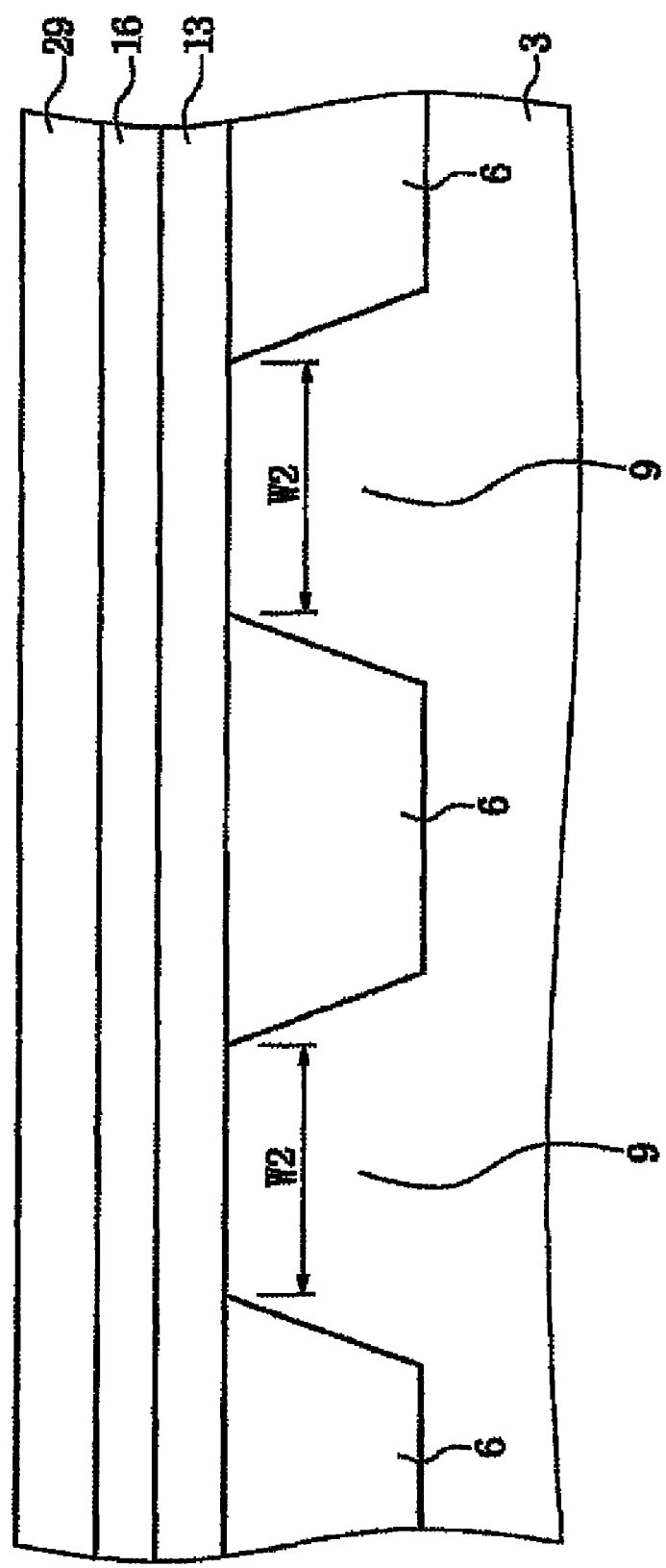
Figure 3C:
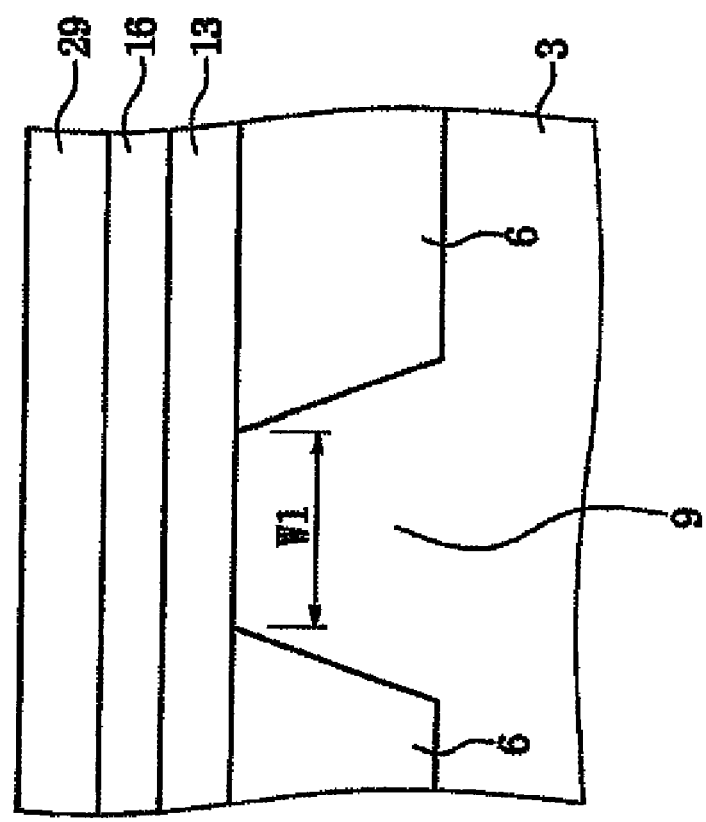

Referring to FIGS. 1 and 3A through 3C, which are cross-sectional views respectively taken along lines I-I', II-II' and III-III' of FIG. 1, according to illustrative embodiments, an inactive region 6 and active regions 9 are disposed in a semiconductor substrate 3 as shown in FIGS. 3A through 3C. The inactive region 6 defines the active regions 9. The inactive region 6 is filled with an isolation layer, which may be formed from at least one insulating material. The active regions 9 may be two-dimensionally formed in rows and columns in the semiconductor substrate 3, as shown in FIG. 1, so that they are arranged horizontally and vertically with respect to one another. A lateral portion of each of the active regions 9 includes a cutout or concave portion, as shown in FIG. 1.

The concave portion is limited to a predetermined length L2 and width S1 in horizontal and vertical directions, respectively, in a center region of a selected active region 9. Accordingly, the center region and an edge region of the selected active region 9 may have different widths W1 and W2, respectively, as shown in FIGS. 1, 3C and 3B. A pad base layer 13 and a pad mask layer 16 are sequentially disposed on the inactive region 6 and the active regions 9, as shown in FIGS. 3A through 3C. The pad base layer 13 and the pad mask layer 16 may include insulating materials having different etch rates, for example.

Molding holes 19 are formed in the inactive region 6 and the active regions 9. That is, the molding holes 19 may extend from surfaces of the inactive region 6 and the active regions 9 toward a lower portion of the semiconductor substrate 3. The molding holes 19 in the inactive region 6 may have the same shape as the molding holes 19 in the active region 9 as shown in FIG. 3A. The molding holes 19 may be formed in the inactive region 6 and the active regions 9 along gate patterns 34 of FIG. 1. Each of the molding holes 19 divides the selected active region 9 into three parts: a center region and two edge regions.

The center region of the selected active region 9 has a predetermined width W1 and length S2, according to the horizontal and vertical directions, as shown in FIGS. 1, 3A, and 3C. Each of the edge regions of the selected active region 9 has predetermined widths W2 and W3, respectively, according to the horizontal and vertical directions as shown in FIGS. 1, 3A, and 3B. A gate insulating layer 23 is disposed in the molding holes 19 as shown in FIG. 3A. The gate insulating layer 23 may be formed in the molding holes 19 using the pad base layer 13 and the pad mask layer 16 as an oxidation buffering layer. The gate insulating layer 23 may formed from one selected from the group consisting of silicon oxide, silicon oxynitride, a metal oxide, and/or a stacked structure thereof.

Gates 26 are respectively disposed in the molding holes 19, as shown in FIG. 3A. The gates 26 may be formed on the gate insulating layer 23 to partially fill the molding holes 19. The gates 26 may be formed from a metal nitride, for example. As shown in FIGS. 3A through 3C, a gate capping layer 29 is disposed on the pad mask layer 16 to cover the gates 26. The gate capping layer 29 may be formed from an insulating material having the same etch rate as the pad mask layer 16.

Figure 4A:
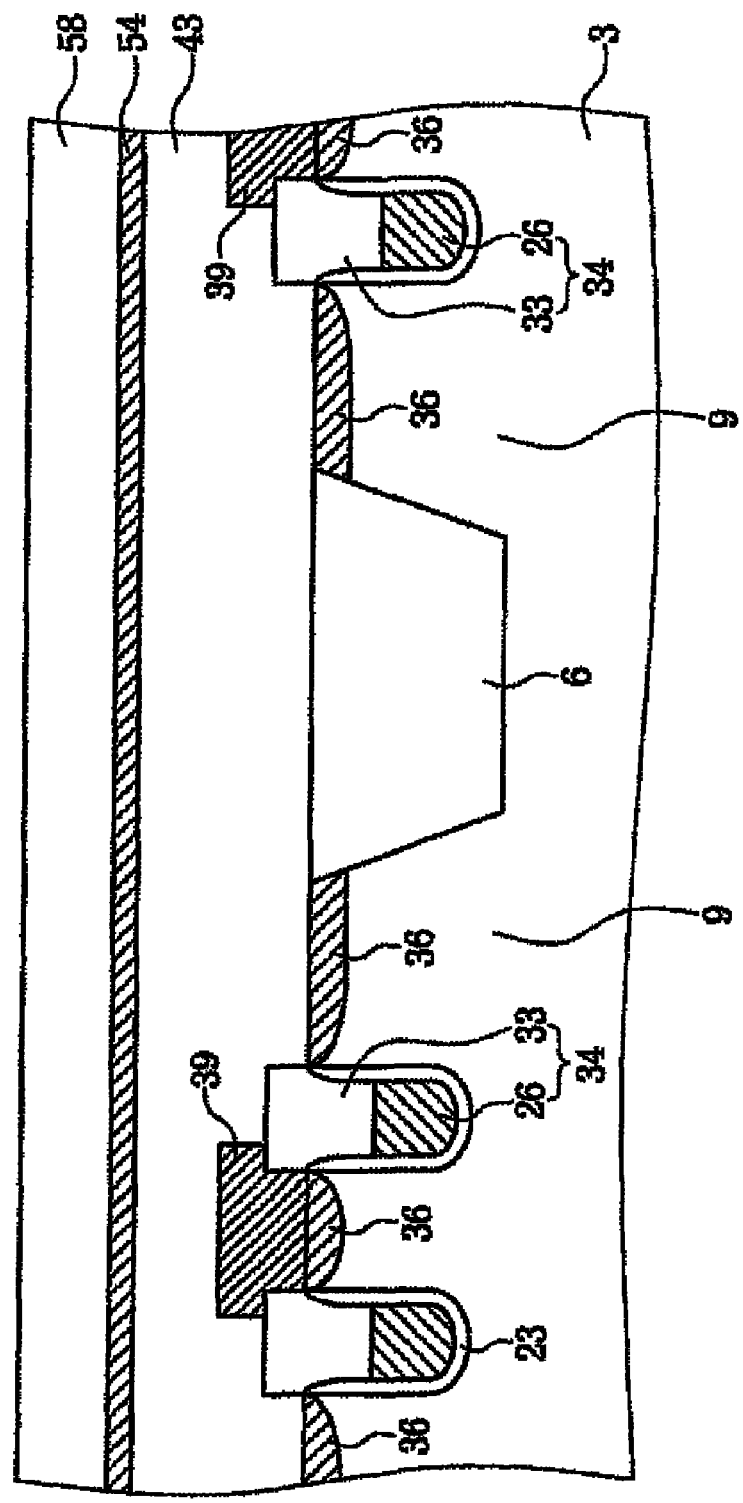

Referring to FIGS. 1 and 4A through 4C, which are cross-sectional views respectively taken along lines I-I', II-II' and III-III' of FIG. 1, according to illustrative embodiments, a chemical mechanical polishing (CMP) technique may be applied to the gate capping layer 29 and the pad mask layer 16 using the pad base layer 13 shown in FIGS. 3A through 3C as an etch buffer layer. The CMP technique is applied until gate capping patterns 33 are formed to fill the respective molding holes 19 as shown in FIG. 4A. The gate capping patterns 33 may protrude from the surfaces of the inactive region 6 and the corresponding active regions 9. Other techniques may be used in place of the CMP technique, such as an etchback technique, for example.

The gate capping patterns 33 and the gates 26 constitute gate patterns 34, as shown in FIG. 4A. The gate patterns 34 are formed parallel to one another and perpendicular to the active regions 9, as shown in FIG. 1. Each of the gate patterns 34 may run across the concave portion of the selected active region 9, as shown in FIG. 1. The gate patterns 34 may extend from upper portions of the inactive region 6 and the active regions 9 toward lower portions thereof as shown in FIG. 4A.

Figure 4B:
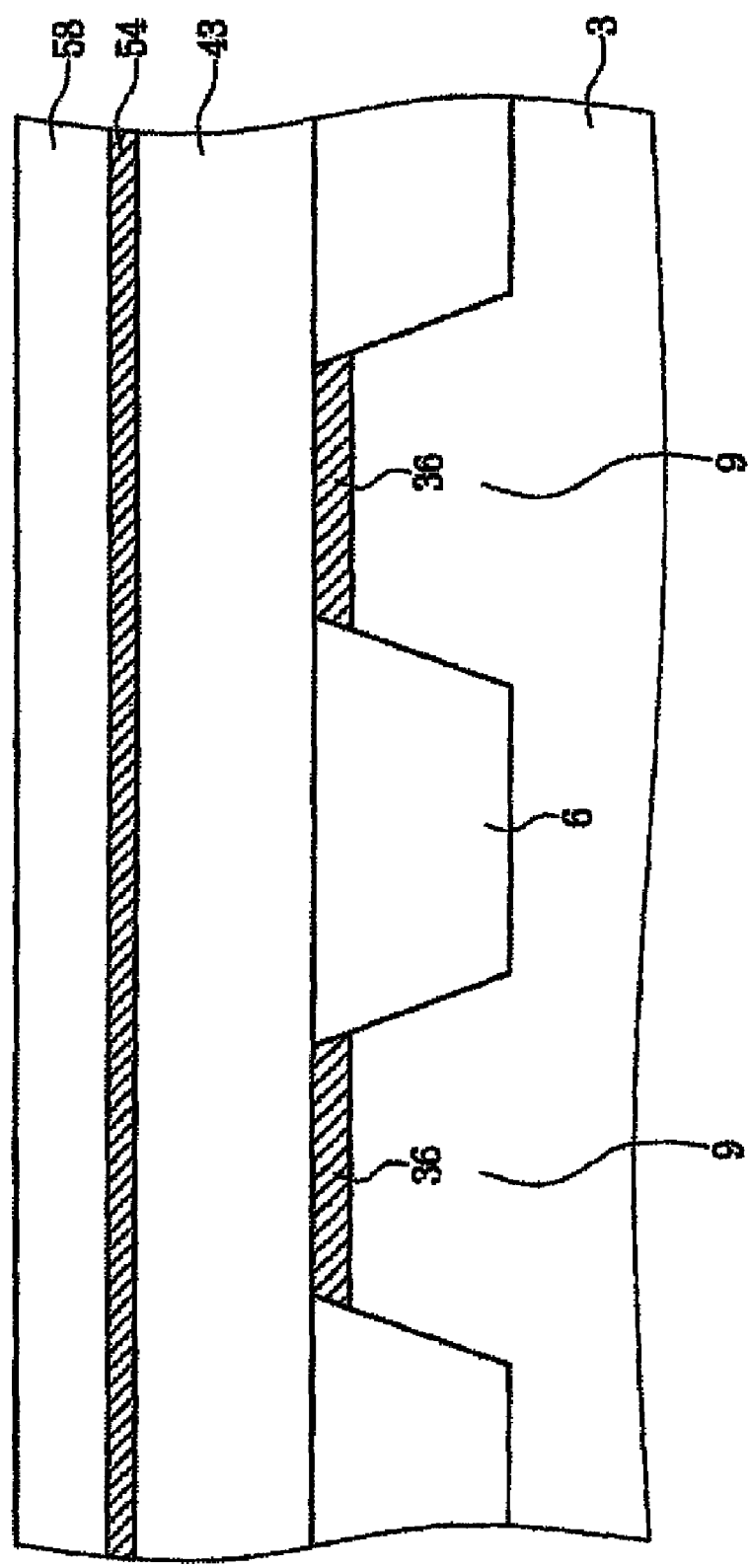

After the CMP technique is applied, the pad base layer 13 is removed from the semiconductor substrate 3 using the gate capping patterns 33 as an etch buffer layer. Impurity ions may be implanted into the active regions 9 using the gate capping patterns 33 and the isolation layer of the inactive region 6 as a mask, thereby forming impurity diffusion regions 36 in the active regions 9, as shown in FIGS. 4A through 4C. The impurity diffusion regions 36 may be formed between the gate patterns 34 and between each of the gate patterns 34 and the inactive region 6.

The impurity diffusion regions 36 have a different conductivity from the semiconductor substrate 3. Landing pads 39 are positioned on the active regions 9, respectively, as shown in FIGS. 1, 4A, and 4C. Each of the landing pads 39 are positioned on the inactive region 6 and the selected active region 9 to be in contact with the selected active region 9. The landing pads 39 may have the same conductivity as the impurity diffusion regions 36, and may be formed between the gate patterns 34.

As shown in FIGS. 4A through 4C, an inter-gate dielectric layer 43 is formed on the inactive region 6 and the active regions 9 to cover the landing pads 39. The inter-gate dielectric layer 43 may be formed from an insulating material having a different etch rate from the isolation layer (inactive region 6), the gate capping patterns 33 and the landing pads 39. Bit line contact holes 46 are formed in the inter-gate dielectric layer 43, as shown in FIGS. 1 and 4C. The bit line contact holes 46 may be formed to expose corresponding landing pads 39.

Bit line contacts 49 are respectively disposed in the bit line contact holes 46, as shown in FIG. 4C. The bit line contacts 49 may be formed to fill the bit line contact holes 46. The bit line contacts 49 are in contact with the landing pads 39 through the bit line contact holes 46, respectively. The bit line contacts 49 may be formed from a conductive material having the same conductivity as the landing pads 39, for example. As shown in FIGS. 4A through 4C, a bit line conductive layer 54 and a bit line capping layer 58 are sequentially stacked on the inter-gate dielectric layer 43 to cover the bit line contacts 49.

The bit line conductive layer 54 may be formed from a conductive material having the same conductivity as the bit line contacts 49, for example. The bit line capping layer 58 may be formed from an insulating material having the same etch rate as the gate capping patterns 33, for example.

Figure 5A:
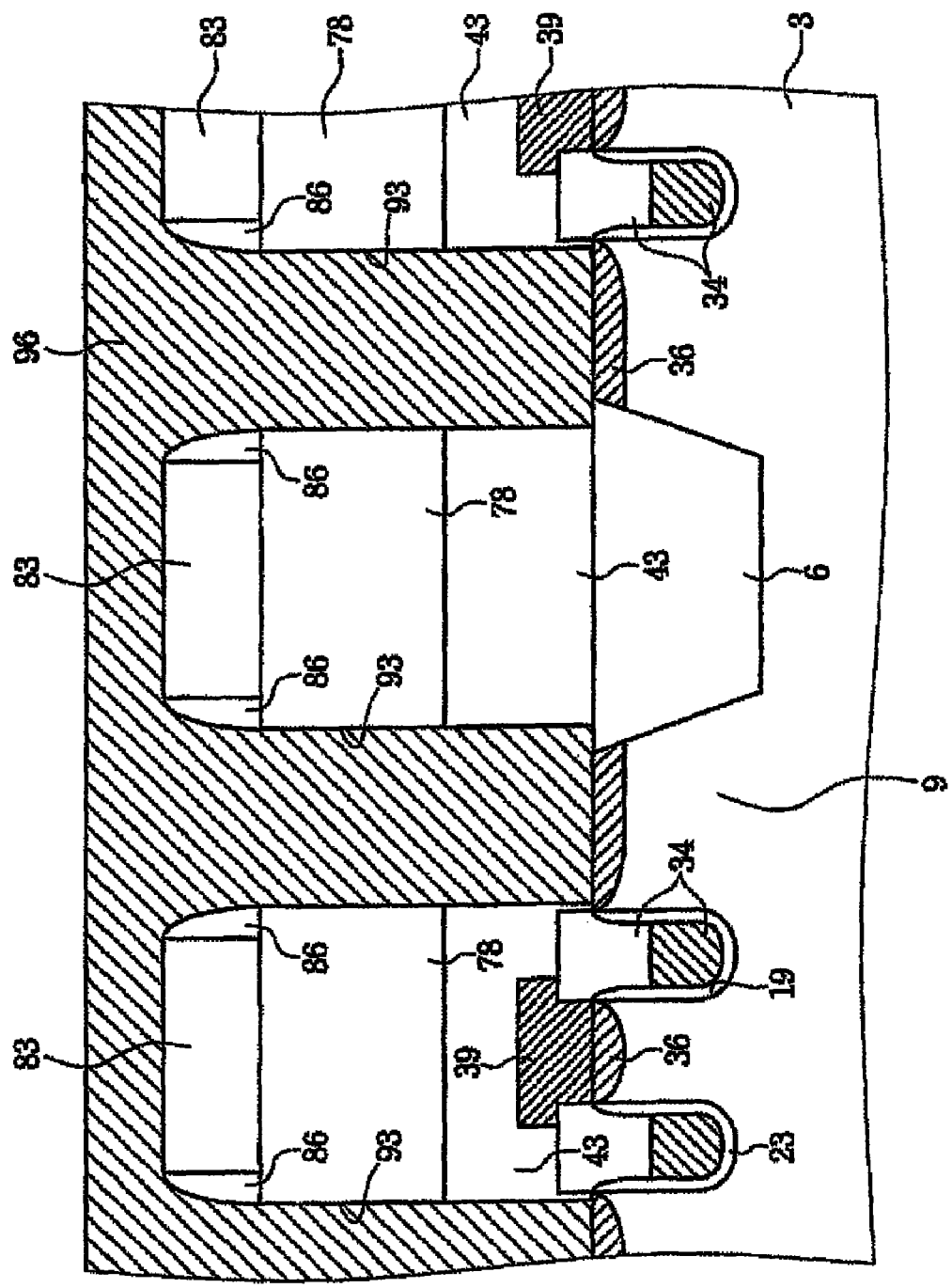
Figure 5C:
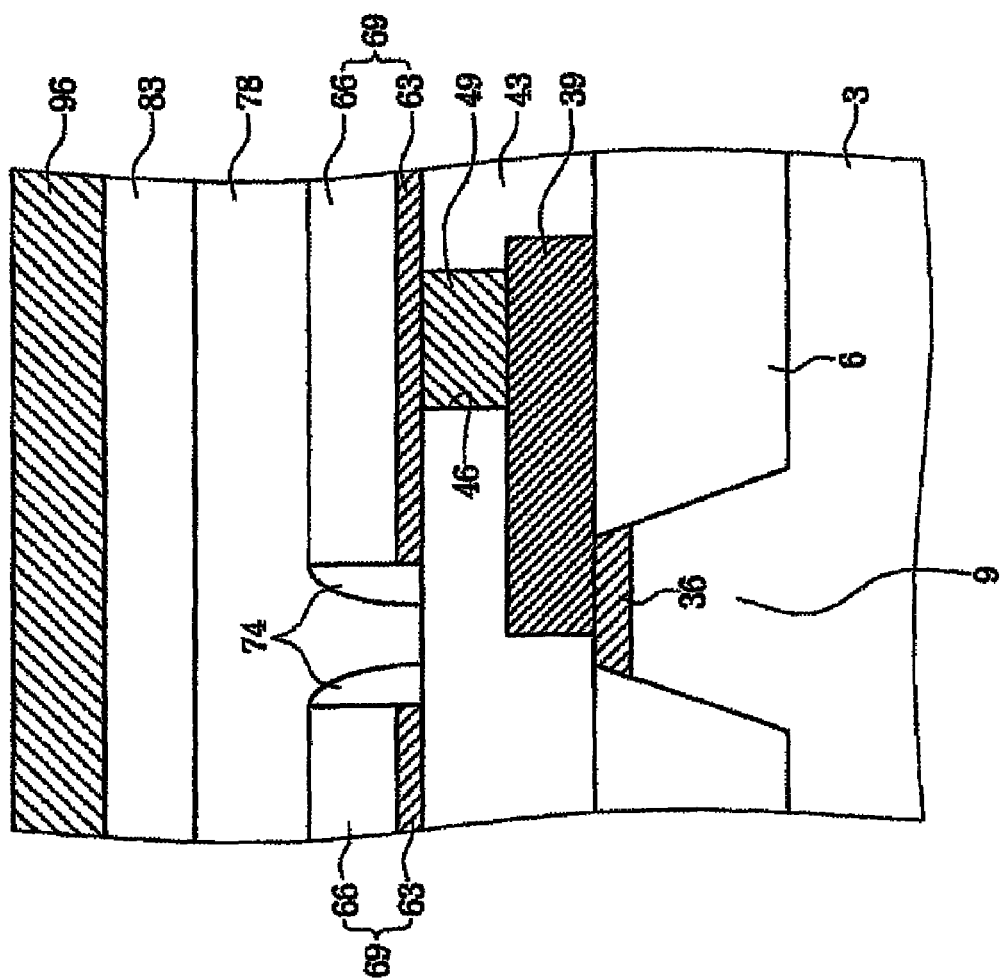

Referring to FIGS. 1 and 5A through 5C, which are cross-sectional views respectively taken along lines I-I', II-II' and III-III' of FIG. 1, according to illustrative embodiments, the bit line capping layer 58 and the bit line conductive layer 54, which are shown in FIGS. 4A through 4C, are sequentially etched to form bit lines 63 and bit line capping patterns 66, as shown in FIGS. 5B and 5C. The bit lines 63 and the bit line capping patterns 66 constitute bit line patterns 69, as shown in FIGS. 1, 5B and 5C. The bit line patterns 69 may be positioned on the inactive region 6, such that the bit line patterns 69 and the gate patterns 34 intersect perpendicularly with respect to one another, as shown in FIG. 1.

As shown in FIG. 1, the bit line patterns 69 include protrusions that protrude from sidewalls of the bit line patterns 69 by a predetermined length L1. The protrusions may be repeatedly and periodically located at both lateral portions of the bit line patterns 69. The protrusions may be formed to face one another at both lateral portions of the bit line patterns 69 in the vicinity of the active regions 9. The protrusions located at one lateral portion of the bit line patterns 69 may respectively correspond to or overlap the concave portions at one lateral portion of the active regions 9.

Protrusions disposed at the other lateral portion of the bit line patterns 69 may respectively overlap the other lateral portion of the active regions 9, which are opposite from the concave portions of the active regions 9. The gate patterns 34 run under the protrusions. The bit line patterns 69 are electrically connected to the active regions 9 through the landing pads 39 and the bit line contacts 49. Bit line spacers 74 may be positioned on sidewalls of the bit line patterns 69, as shown in FIGS. 5B and 5C. The bit line spacers 74 may be formed form an insulating material having the same etch rate as the bit line capping patterns 66, for example.

As shown in FIGS. 5A and 5C, a bit line interlayer insulating layer 78 is disposed on the inter-gate dielectric layer 43 to cover the bit line patterns 69 and the bit line spacers 74. The bit line interlayer insulating layer 78 may be formed from an insulating material having the same etch rate as the inter-gate dielectric layer 43, for example.

Node mask patterns 83 are disposed on the bit line interlayer insulating layer 78, as shown in FIGS. 1, 5A, and 5C. The node mask patterns 83 may be formed from an insulating material having a different etch rate from the bit line interlayer insulating layer 78, for example. The node mask patterns 83 are arranged perpendicular to the bit line patterns 69 between the gate patterns 34 and between the active regions 9, as shown in FIG. 1. Mask spacers 86 may be positioned on sidewalls of the node mask patterns 83, as shown in FIG. 5A. The mask spacers 86 may be formed from an insulating material having the same etch rate as the bit line spacers 74, for example.

The bit line interlayer insulating layer 78 and the inter-gate dielectric layer 43 are sequentially etched using the node mask patterns 83, the mask spacers 86, the bit line patterns 69, and the bit line spacers 74 as a mask. As a result, node contact holes 93 are formed in the inter-gate dielectric layer 43 and the bit line interlayer insulating layer 78, as shown in FIGS. 5A and 5B. The node contact holes 93 may expose edge portions of the active regions 9 between the gate patterns 34, between the bit line patterns 69, and between the bit line spacers 74.

As shown in FIGS. 5A through 5C, a node contact layer 96 is disposed on the bit line patterns 69 and the node mask patterns 83 to fill the node contact holes 93. The node contact layer 96 may be formed from a conductive material having the same conductivity as the impurity diffusion regions 36 in the active regions 9, for example.

Figure 6A:
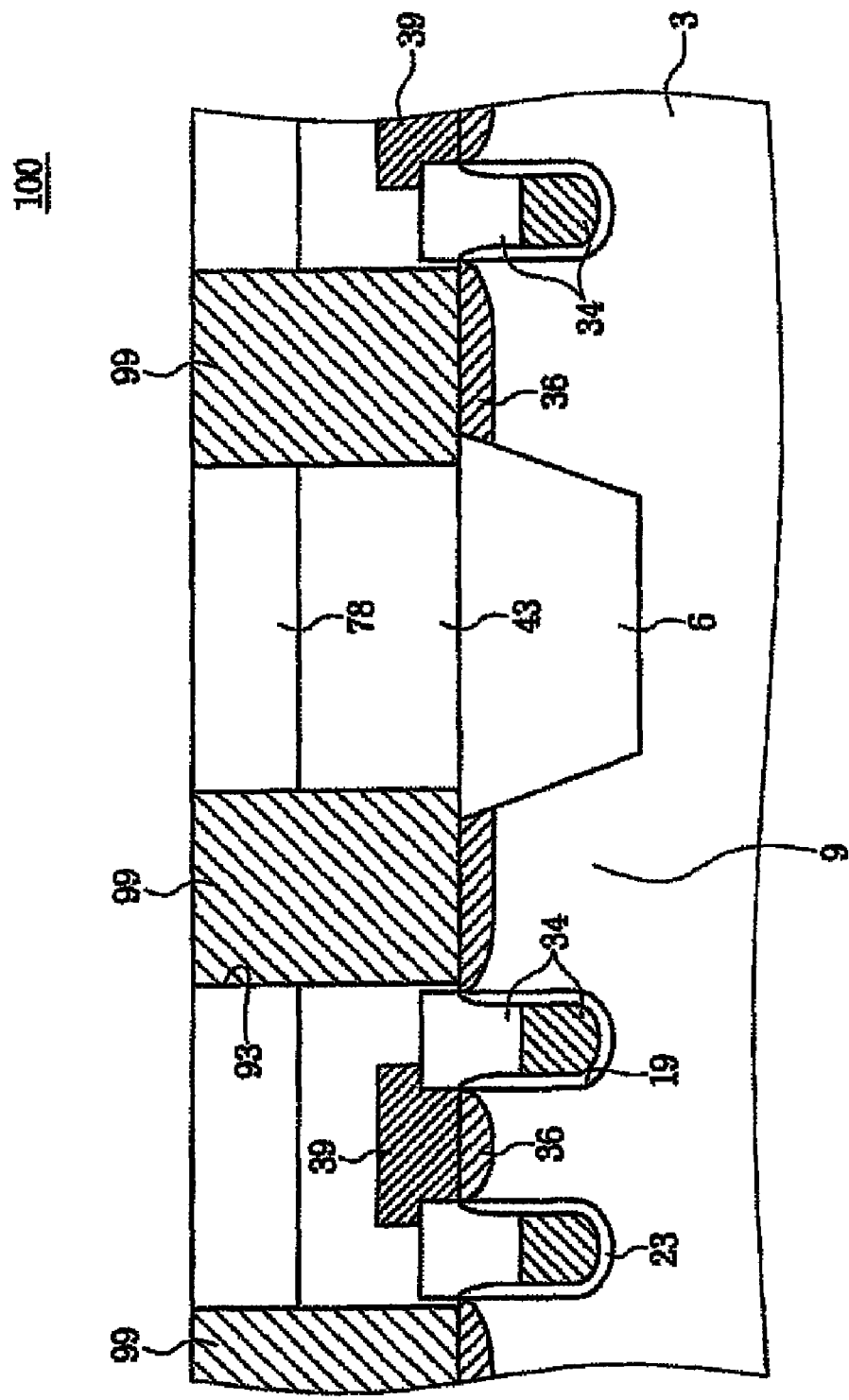

Referring to FIGS. 1 and 6A trough 6C, which are cross-sectional views respectively taken along lines I-I', II-II' and III-III' of FIG. 1, according to illustrative embodiments, a CMP technique may be applied to the node mask patterns 83, the mask spacers 86, the bit line interlayer insulating layer 78 and the node contact layer 96, using the bit line patterns 69 and the bit line spacers 74, which are shown in FIGS. 5A through 5C, as an etch buffer layer. The CMP technique is applied until node contacts 99 are respectively formed in the node contact holes 93, as shown in FIGS. 6A and 6B. The node contacts 99 may completely contact the edge regions of the active regions 9. Other techniques may be used in place of the CMP technique, such as an etchback technique, for example.

As a result, as shown in FIGS. 1 and 6A through 6C, the node contacts 99 constitute a cell structure of a semiconductor device along with the active regions 9, the gate patterns 34, the landing pads 39, the bit line contacts 49 and the bit line patterns 69. Storage nodes (not shown) may be respectively formed on the node contacts 99.

Figure 2:
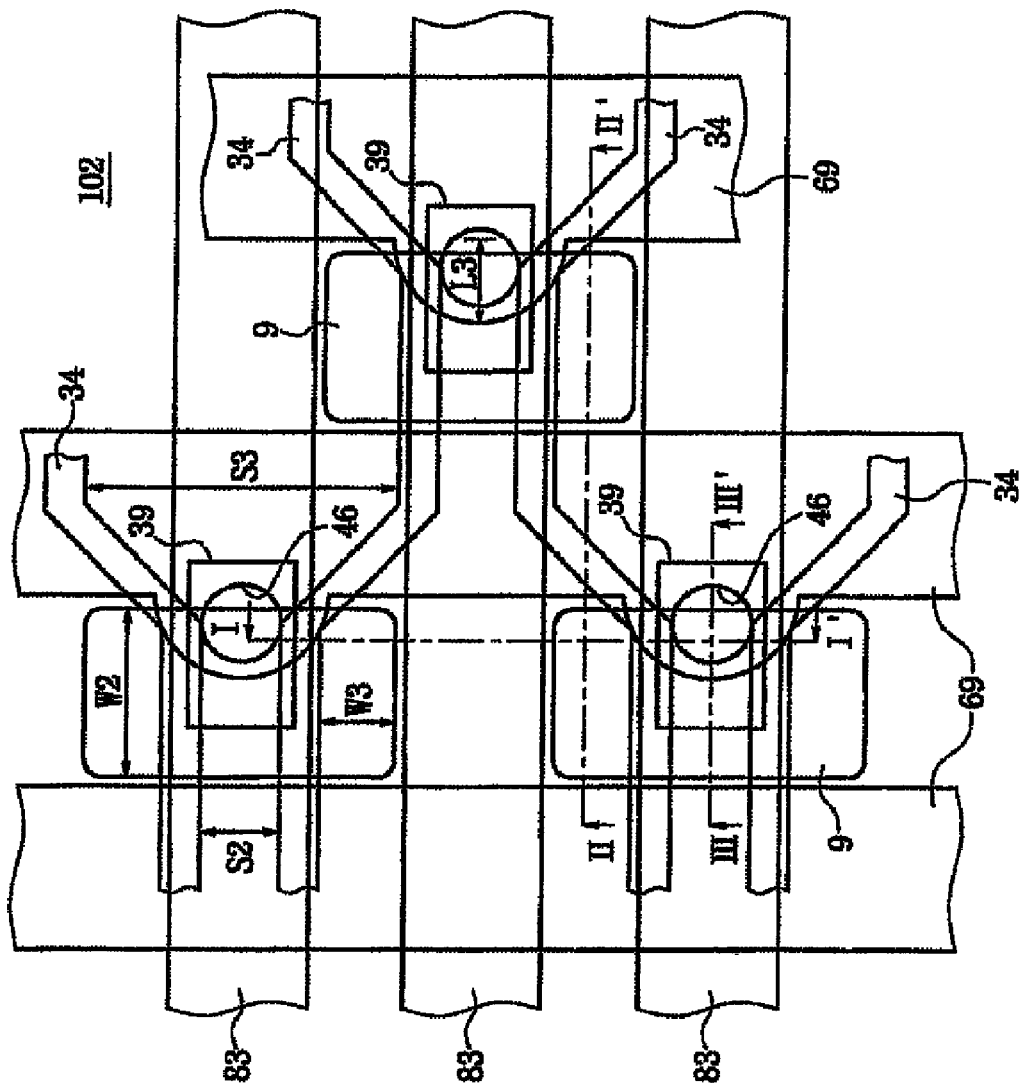
FIG. 2 is a plan view of a cell structure of a semiconductor device, according to illustrative embodiments.

FIG. 2 is a plan view of a cell structure of a semiconductor device, according to illustrative embodiments, and FIGS. 7A through 10C are various cross-sectional views of FIG. 2, which illustrate a method of fabricating a cell structure of a semiconductor device according to illustrative embodiments. In FIGS. 2 and 7A through 10C, the same reference numerals are used to denote the same or similar elements as in FIGS. 1 and 3A through 6C.

Figure 7B:
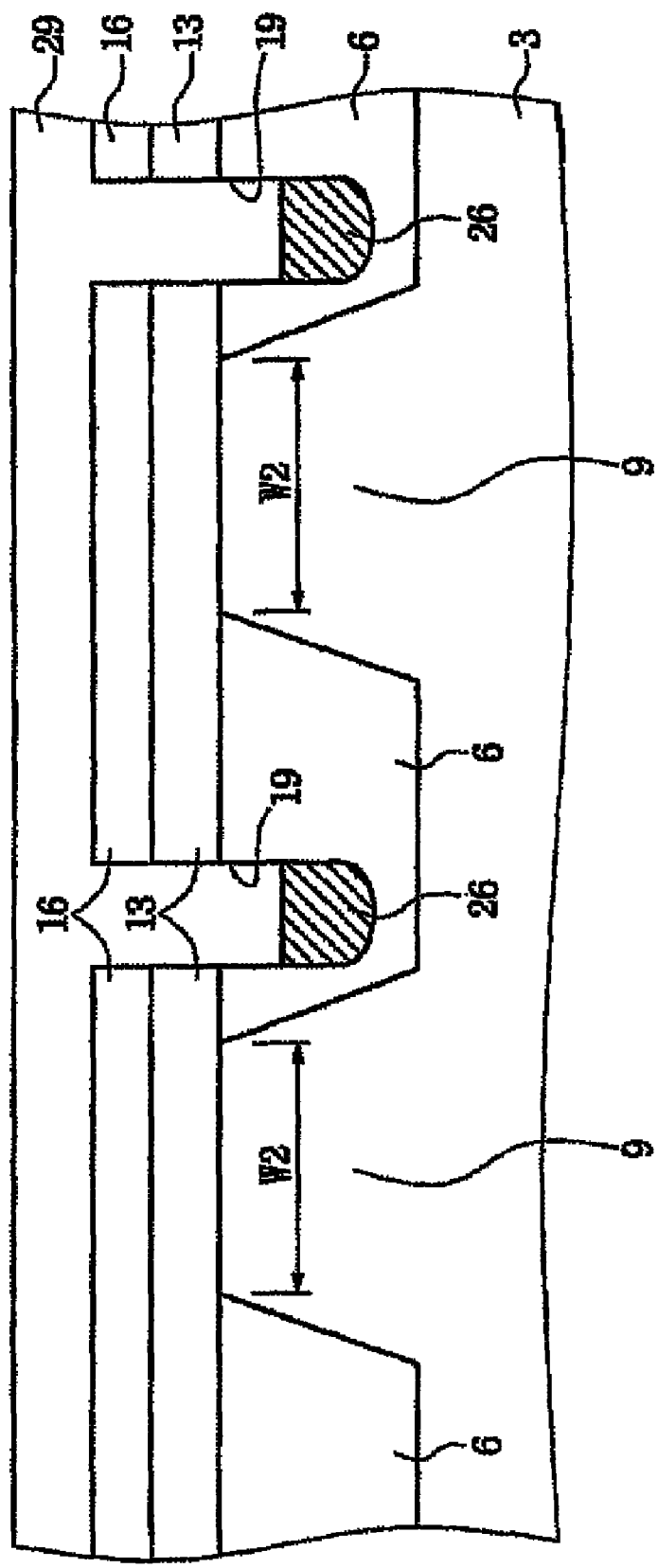
FIGS. 7A through 10C are cross-sectional views taken along lines I-I', II-II', and III-III' of FIG. 2, which illustrate a method of fabricating a cell structure of a semiconductor device, according to illustrative embodiments.

Referring to FIGS. 2 and 7A through 7C, which are cross-sectional views respectively taken along lines I-I', II-II' and III-III' of FIG. 2, according to illustrative embodiments, an inactive region 6 and active regions 9 are disposed in a semiconductor substrate 3, as shown in FIGS. 7A through 7C. The active regions 9 may be two-dimensionally disposed in rows and columns in the semiconductor substrate 3 to form a zig-zag line, as shown in FIG. 2. Each of the active regions 9 does not have a concave portion. Therefore, as shown in FIGS. 2 and 7B and 7C, center and edge regions of each of the respective active regions 9 may have the same width W2.

A pad base layer 13 and a pad mask layer 16 are sequentially formed on the inactive region 6 and the active regions 9, as shown in FIGS. 7A through 7C. Molding holes 19 are formed in the inactive region 6 and the active regions 9, as shown in FIGS. 7A and 7B. The molding holes 19 are formed in the active regions 9 and the inactive region 6 along gate patterns 34 of FIG. 2. Each of the molding holes 19 may divide a selected active region 9 into three parts: a center region and two edge regions.

The center region of the selected active region 9 may have a predetermined length W2 and width S2 in the horizontal and vertical directions, as shown in FIGS. 2, 7A, and 7C. Each of edge regions of the selected active region 9 has a predetermined length W2 and width W3 in the horizontal and vertical directions, as shown in FIGS. 2, 7A, and 7B. A gate insulating layer 23 is disposed in the molding holes 19, as shown in FIG. 7A. Since the gate insulating layer 23 is formed more finely in an isolation layer 6 than in the active regions 9, it will not be shown in the molding holes 19 of the inactive region 6. Gates 26 are respectively formed in the molding holes 19, as shown in FIGS. 7A and 7B. The gates 26 may be disposed on the gate oxide layer 23 to partially fill the molding holes 19. As shown in FIGS. 7A through 7C, a gate capping layer 29 is formed on the pad mask layer 16 to cover the gates 26.

Figure 8A:
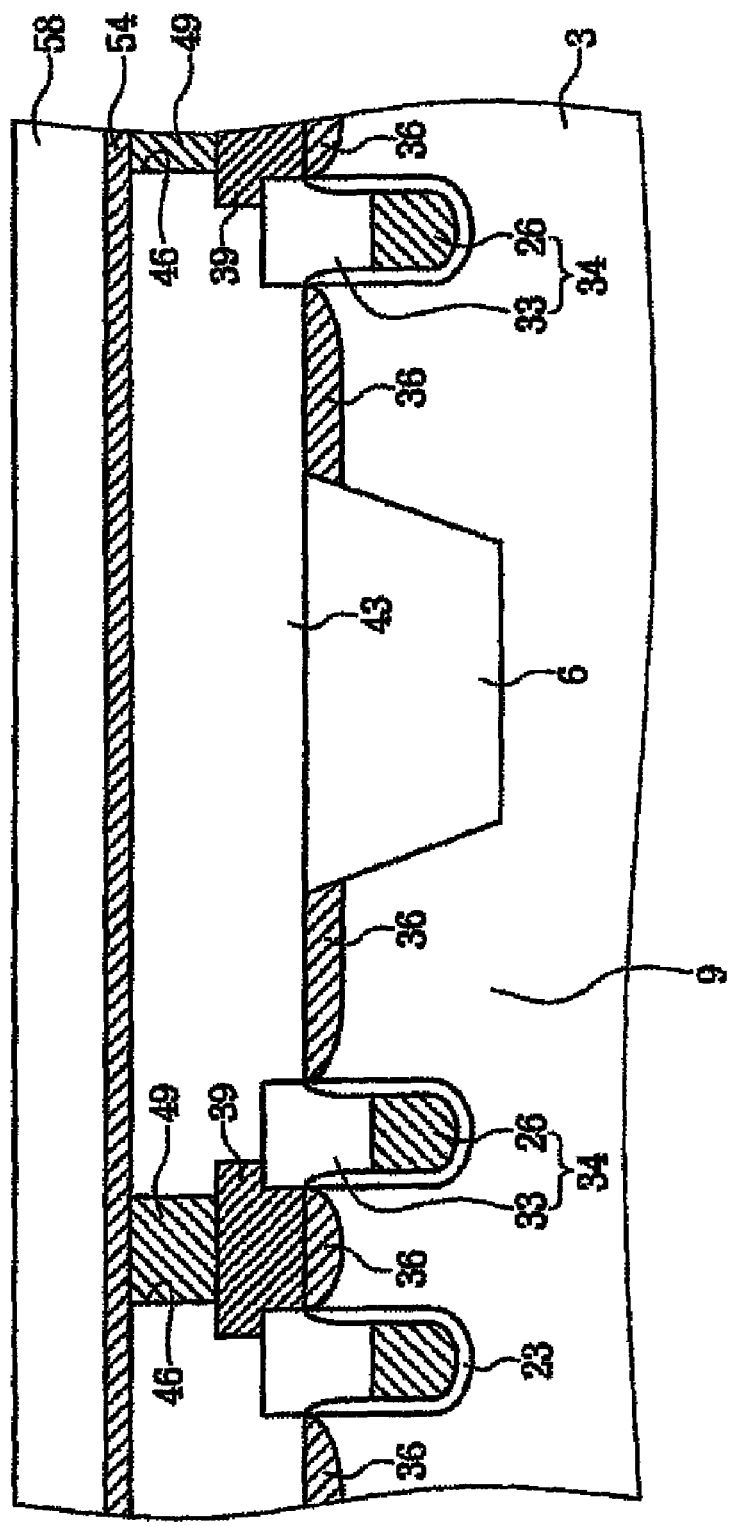
Figure 8B:
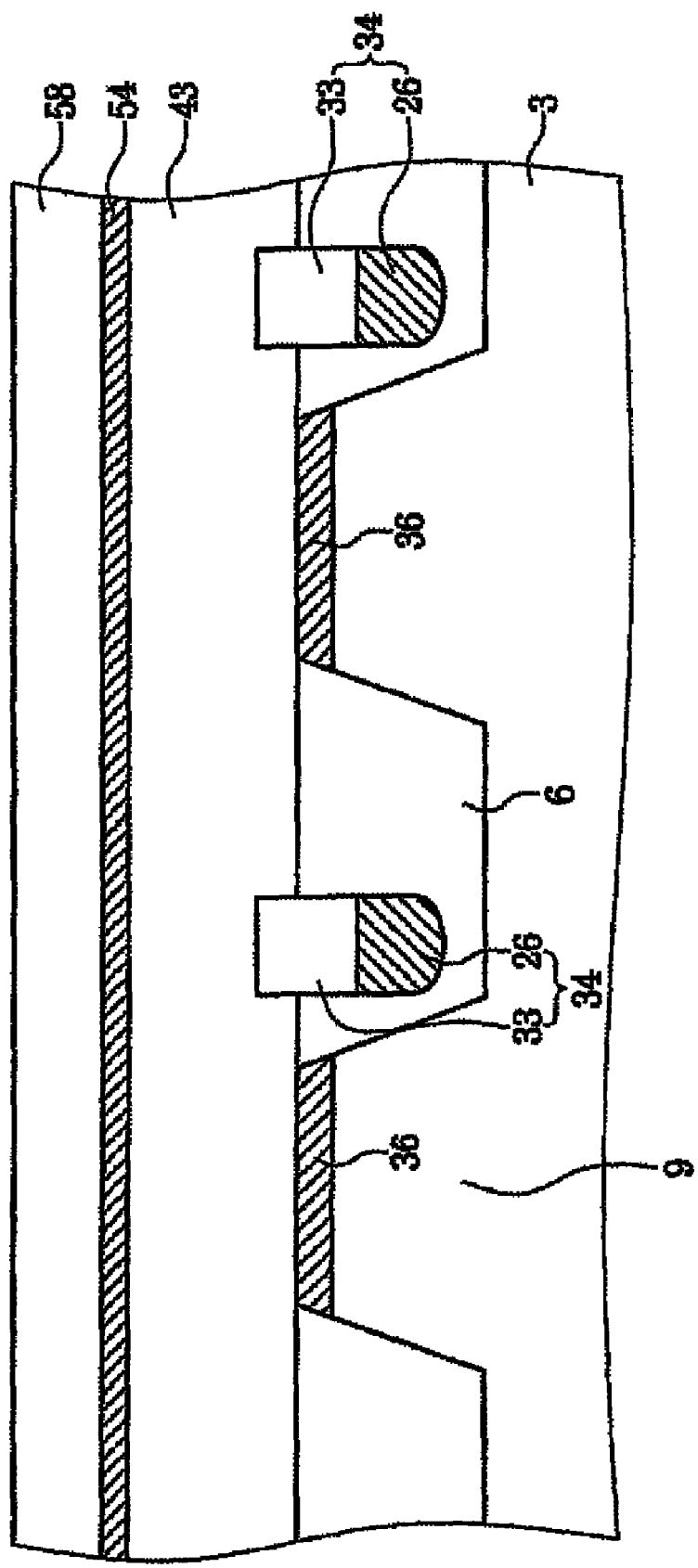

Referring to FIGS. 2 and 8A through 8C, which are cross-sectional views respectively taken along lines I-I', II-II' and III-III' of FIG. 2, according to illustrative embodiments, a CMP technique may be applied to the gate capping layer 29 and the pad mask layer 16 using the pad base layer 13 shown in FIGS. 7A through 7C as an etch buffer layer. The CMP technique is applied until gate capping patterns 33 are formed to fill the respective molding holes 19, as shown in FIGS. 8A and 8B. Other techniques may be used in place of the CMP technique, such as an etchback technique, for example. The gate capping patterns 33 and the gates 26 constitute the gate patterns 34, as shown in FIGS. 8A and 8B.

Generally, in the depicted embodiment, the gate patterns 34 enter the active regions 9 through corresponding first edges or lateral portions, and adjacent gate patterns 34 extend parallel to one another in the active regions 9 separated by a first width S2, as shown in FIG. 2. Also, the gate patterns 34 exit the active regions 9 through opposite corresponding second edges or lateral portions, diagonally extending away from one another. The adjacent gate patterns 34 then extend parallel to one another in the inactive regions 6 separated by a second width S3 greater than the first width S2.

More specifically, two adjacent gate patterns 34 are parallel to one another and separated by the first width S2 at the first lateral portion of a selected active region 9, as shown in FIG. 2. The two adjacent gate patterns 34 are arranged diagonally with respect to one another at the second lateral portion of the selected active region 9, and extend in opposing diagonal directions through at least a portion of the inactive region 6. The adjacent gate patterns 34 are again parallel to one another and separated by the second width S3 at first lateral portions of two adjacent active regions 9, respectively. The gate patterns 34 extend from upper portions of the inactive region 6 and the active regions 9 toward lower portions thereof, as shown in FIGS. 8A and 8B.

After the CMP technique is applied, the pad base layer 13 may be removed from the semiconductor substrate 3 using the gate capping patterns 33 as an etch buffer layer. Impurity ions may be implanted into the active regions 9 using the gate capping patterns 33 and the isolation layer of the inactive region 6 as a mask, thereby forming impurity diffusion regions 36 in the active regions 9, as shown in FIGS. 8A through 8C.

Figure 8C:
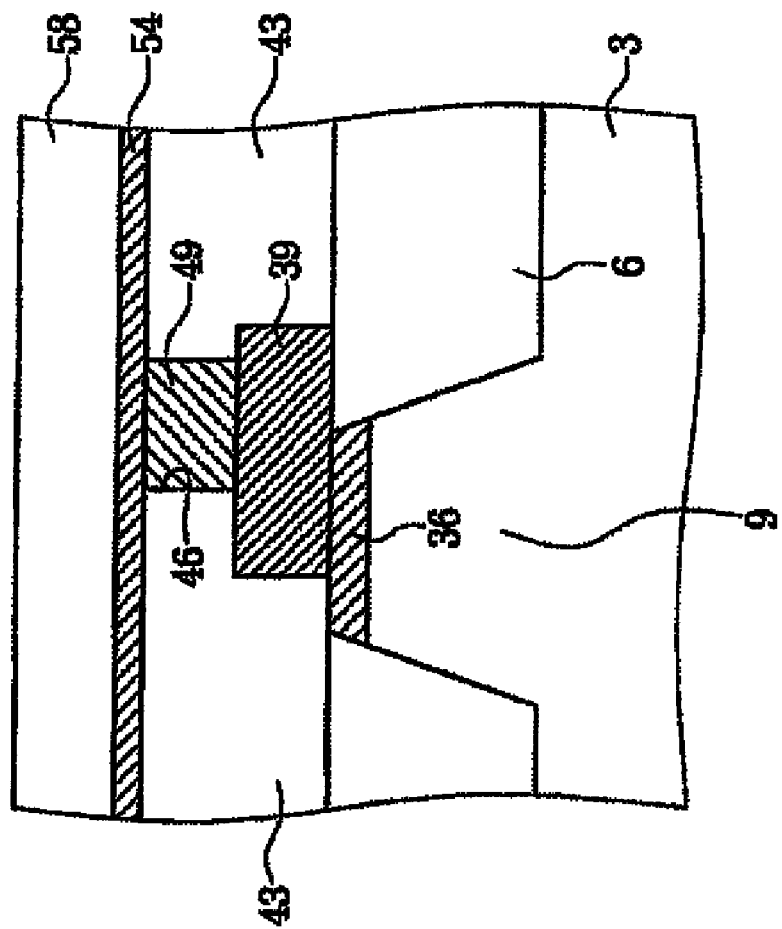

Landing pads 39 are respectively disposed on the active regions 9, as shown in FIGS. 2, 8A, and 8C. The landing pads 39 are formed between the gate patterns 34. Each of the landing pads 39 may be positioned on the inactive region 6 and the selected active region 9 to be in contact with the selected active region 9. As shown in FIGS. 8A through 8C, an inter-gate dielectric layer 43 is formed on the inactive region 6 and the active regions 9 to cover the landing pads 39. Bit line contact holes 46 are formed in the inter-gate dielectric layer 43, as shown in FIGS. 2, 8A, and 8C. Bit line contacts 49 are respectively disposed in the bit line contact holes 46, as shown in FIGS. 8A and 8C.

The bit line contacts 49 are in contact with the landing pads 39 through the bit line contact holes 46, respectively. As shown in FIGS. 8A through 8C, a bit line conductive layer 54 and a bit line capping layer 58 may be sequentially stacked on the inter-gate dielectric layer 43 to cover the bit line contacts 49.

Figure 9A:
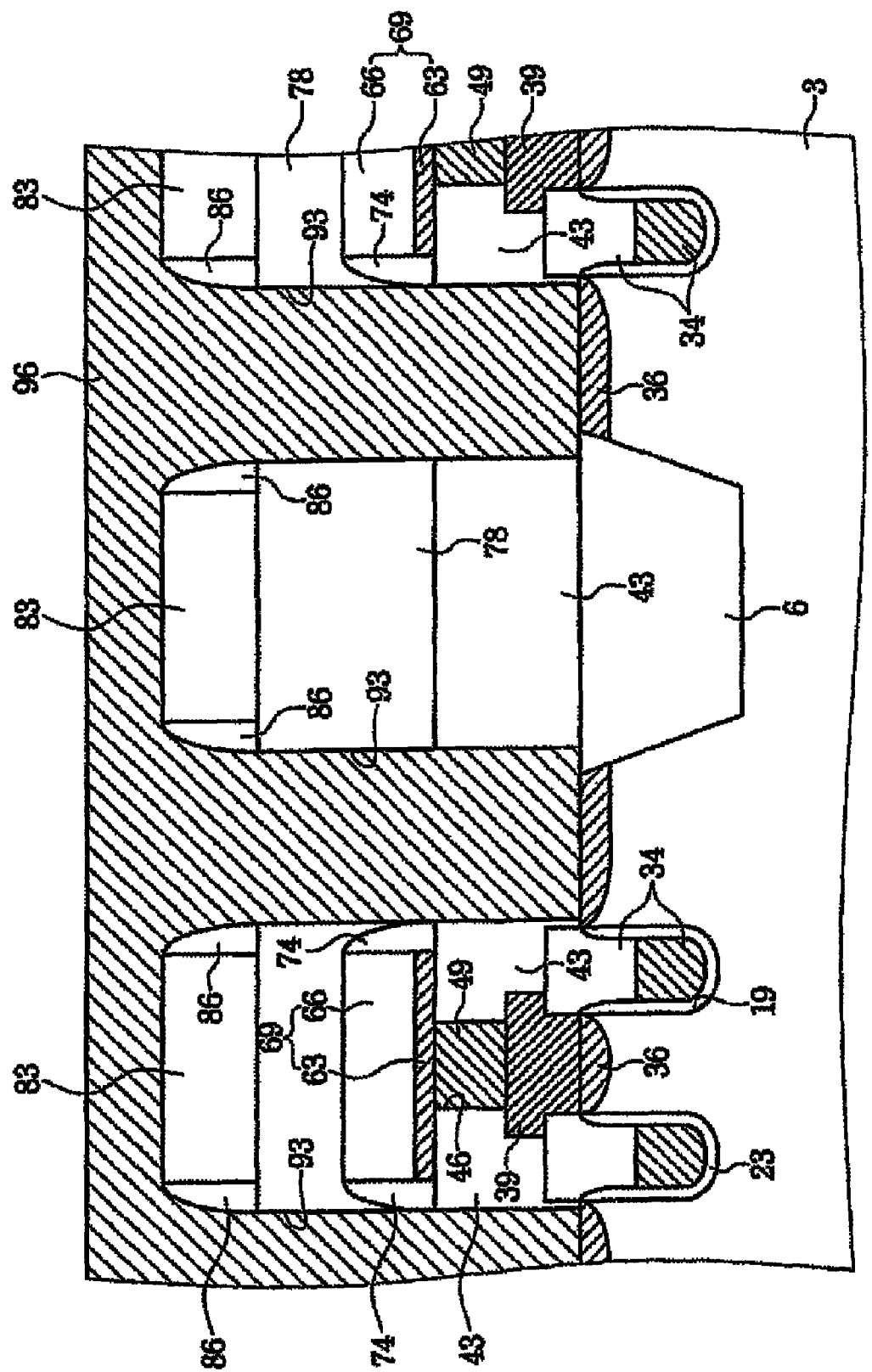
Figure 9B:
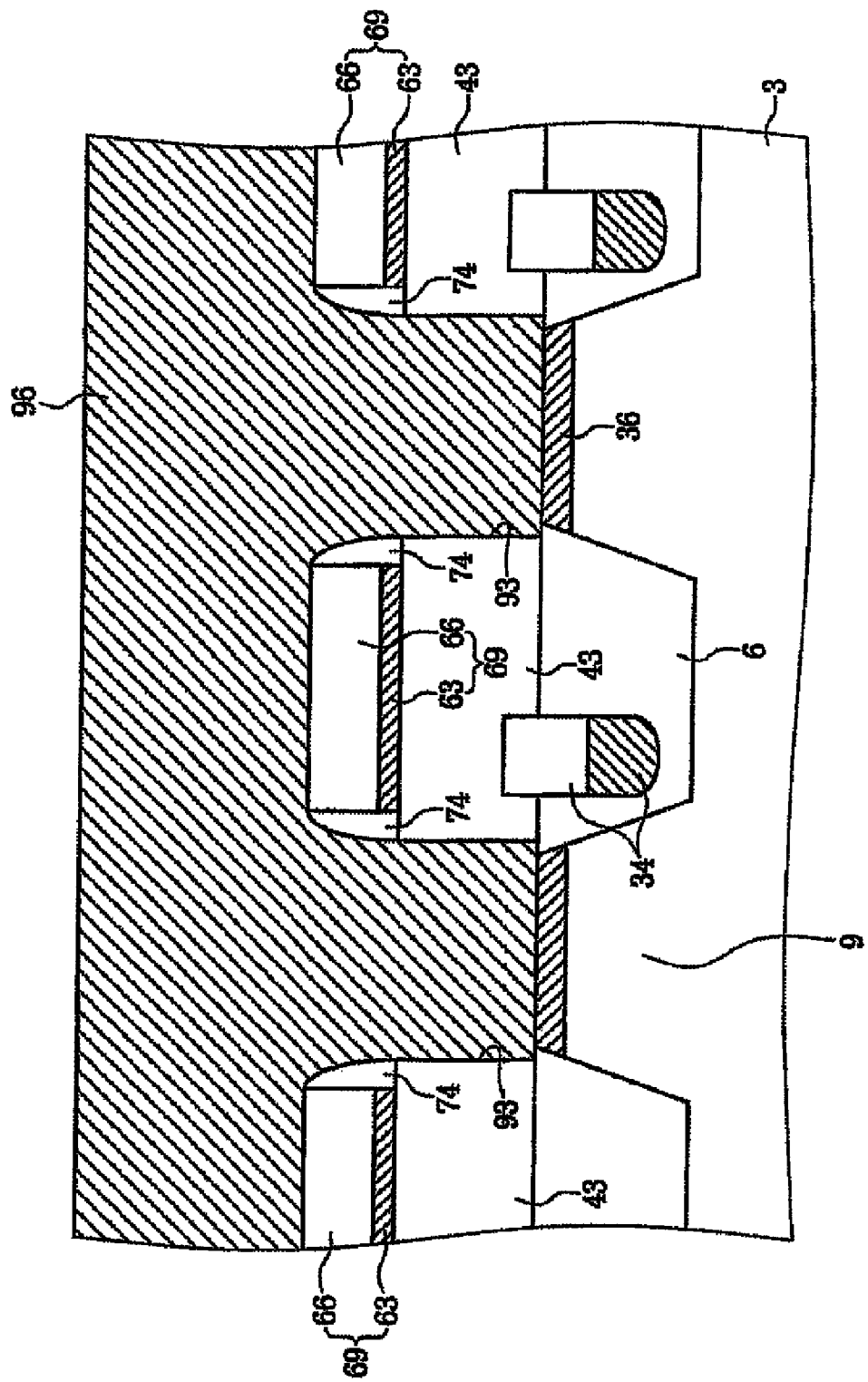
Figure 9C:
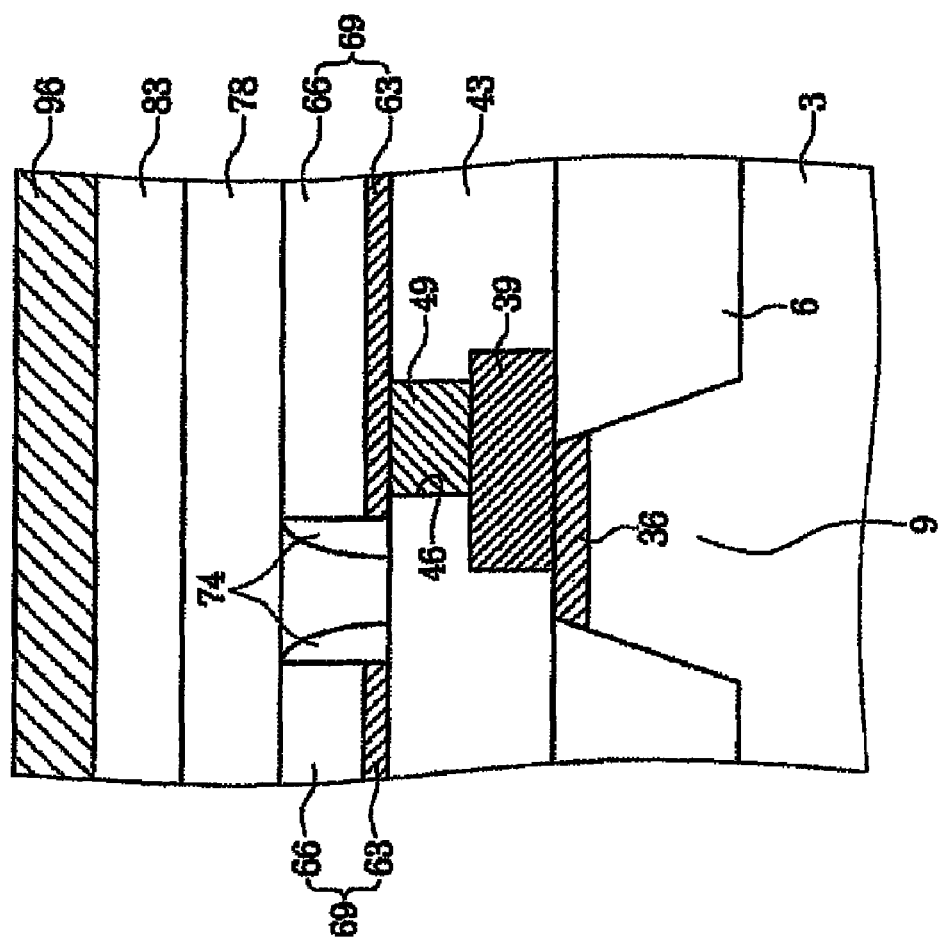

Referring to FIGS. 2 and 9A through 9C, which are cross-sectional views respectively taken along lines I-I', II-II' and III-III of FIG. 2, according to illustrative embodiments, the bit line capping layer 58 and the bit line conductive layer 54 shown in FIGS. 8A through 8C are sequentially etched to form bit lines 63 and bit line capping patterns 66, as shown in FIGS. 9A trough 9C. The bit lines 63 and the bit line capping patterns 66 constitute bit line patterns 69, as shown in FIGS. 9A through 9C. The bit line patterns 69 are positioned on the inactive region 6 and intersect the gate patterns 34, as shown in FIG. 2.

The bit line patterns 69 include protrusions that protrude from sidewalls of the bit line patterns 69 by a predetermined length L3, as shown in FIG. 2. The protrusions may be repeatedly located along lateral portions of the bit line patterns 69. The protrusions partially overlap the active regions 9 and the landing pads 39. Accordingly, the protrusions extend from the lateral portions of the bit line patterns 69 toward the active regions 9 and contact the bit line contacts 49. Gate patterns 34 run under the protrusions.

The bit line patterns 69 are electrically connected to the active regions 9 through the landing pads 39, the bit line contacts 49 and the protrusions. Bit line spacers 74 may be positioned on sidewalls of the bit line patterns 69, as shown in FIGS. 9A through 9C. As shown in FIGS. 9A and 9C, a bit line interlayer insulating layer 78 is disposed on the inter-gate dielectric layer 43 to cover the bit line patterns 69 and the bit line spacers 74. Node mask patterns 83 are disposed on the bit line interlayer insulating layer 78, as shown in FIGS. 2, 9A, and 9C.

The node mask patterns 83 are perpendicular to the bit line patterns 69 and formed between the gate patterns 34 and between the active regions 9, as shown in FIG. 2. Mask spacers 86 may be positioned on sidewalls of the node mask patterns 83, as shown in FIGS. 9A and 9C. The bit line interlayer insulating layer 78 and the inter-gate dielectric layer 43 are sequentially etched using the node mask patterns 83, the mask spacers 86, the bit line spacers 74 and the bit line patterns 69 as a mask, thereby forming node contact holes 93, as shown in FIGS. 9A and 9B.

The node contact holes 93 may expose the edge regions of the active regions 9 between the gate patterns 34, between the bit line patterns 69 and between the bit line spacers 74. As shown in FIGS. 9A through 9C, a node contact layer 96 is disposed on the bit line patterns 69 and the node mask patterns 83 to fill the node contact holes 93.

Referring to FIGS. 2 and 10A through 10C, which are cross-sectional views respectively taken along lines I-II, II-II' and II-III' of FIG. 2, according to illustrative embodiments, a CMP technique may be applied to the node mask patterns 83, the mask spacers 86, the bit line interlayer insulating layer 78 and the node contact layer 96 using the bit line patterns 69 and the bit line spacers 74, which are shown in FIGS. 9A through 9C, as an etch buffer layer. The CMP technique is applied until node contacts 99 are respectively formed in the node contact holes 93, as shown FIGS. 10A and 10B. The node contacts 99 may completely contact the edge regions of the active regions 9. Other techniques may be used in place of the CMP technique, such as an etchback technique, for example.

Figure 10A:
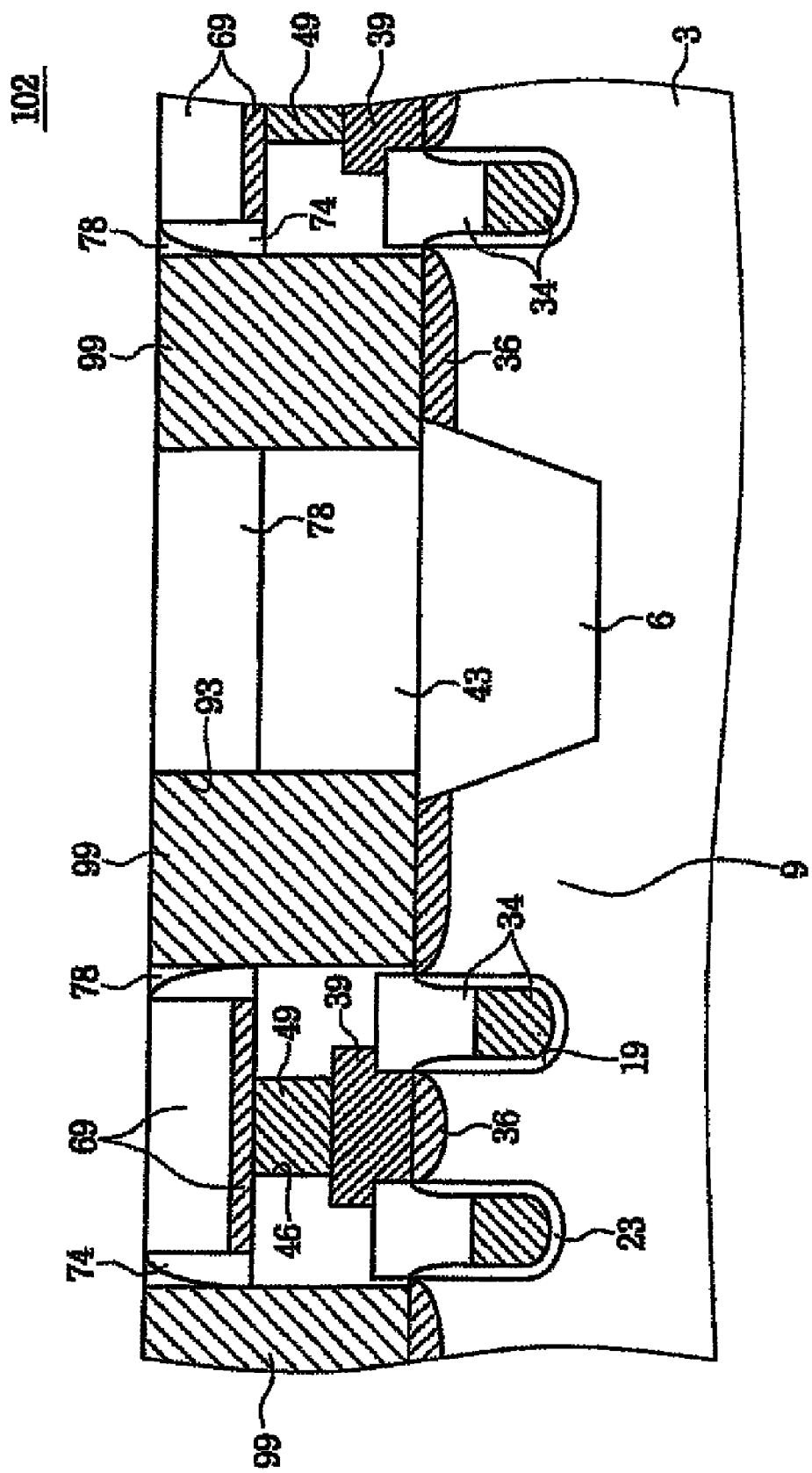
Figure 10C:
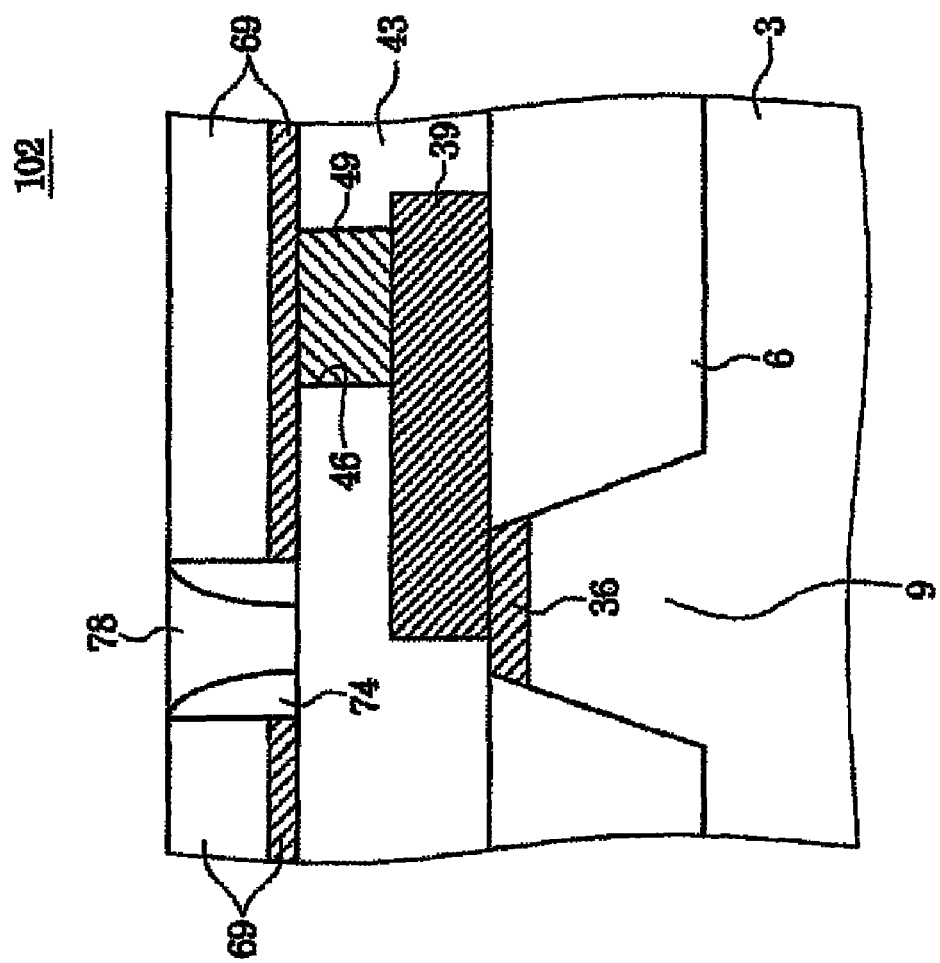

As a result the node contacts 99 constitute a cell structure 102 of a semiconductor device, along with the active regions 9, the gate patterns 34, the landing pads 39, the bit line contacts 49 and the bit line patterns 69, as shown in FIGS. 2 and 10A through 1C. Storage nodes (not shown) may be respectively formed on the node contacts 99.

As described above, illustrative embodiments provide a cell structure of a semiconductor device in which gate patterns and bit line patterns intersect perpendicularly with respect to one another on a semiconductor substrate, and the bit line patterns are positioned on an inactive region. Accordingly, the semiconductor device according to the illustrative embodiments may include the cell structure configured to positively correspond to an alignment system of a semiconductor photolithography apparatus and predict a process margin for a semiconductor fabrication process unlike the conventional art. In addition, since the cell structure according to the illustrative embodiments can predict a process margin between elements, it can provide a greater process margin in the same design rule used in the conventional art.

Furthermore, since the bit line patterns according to the illustrative embodiments can overlap active regions minimally through protrusions, the areas of the active regions exposed by the bit line patterns and the gate patterns can be increased more than in the conventional case. As a result, according to the illustrative embodiments, an electrical short between the elements of the cell structure of the semiconductor device can be prevented more effectively than in the conventional art. Also, contact resistance between the active regions and storage nodes can be reduced, further improving the electrical properties of the semiconductor device.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A cell structure of a semiconductor device, comprising:
   a first active region in a semiconductor substrate, the first active region having a first concave portion;
   an inactive region in the semiconductor substrate defining the first active region;
   a first gate pattern in the first active region, the first gate pattern being arranged perpendicular to the first active region;
   a first landing pad on the first active region and the inactive region contacting the first active region; and
   a bit line pattern on the inactive region configured to intersect the first gate pattern perpendicularly, the bit line pattern being electrically connected to the first landing pad,
   wherein the bit line pattern comprises a first protrusion extending over the first active region opposite the first concave portion of the first active region and a second protrusion extending into a second concave portion of a second active region adjacent the first active region.

2. The cell structure according to claim 1, wherein the first concave portion of the first active region is in a selected lateral portion of the first active region, which overlaps a portion of the first gate pattern.

3. The cell structure according to claim 2, wherein the first gate pattern extends across the first concave portion of the first active region, and below the first protrusion of the bit line pattern.

4. The cell structure according to claim 3, further comprising:
a bit line contact between the first landing pad and the bit line pattern, the bit line contact contacting the first landing pad and the bit line pattern on the inactive region.

5. The cell structure according to claim 4, wherein the first protrusion of the bit line pattern extends from a first lateral portion of the bit line pattern and overlaps the first active region opposite the first concave portion of the first active region.

6. The cell structure according to claim 5, further comprising:
the second active region having the same shape as the first active region; and
a second gate pattern in the second active region having the same shape as the first gate pattern,
wherein the second protrusion extends from a second lateral portion of the bit line pattern and has the same shape as the first protrusion, and
wherein the second active region is arranged horizontally with respect to the first active region along a row of the semiconductor substrate.

7. The cell structure according to claim 6, wherein the first and second gate patterns are parallel to each other and extend across the first concave portion of the first active region, the second concave portion of the second active region, and the first and second protrusions of the bit line pattern.

8. The cell structure according to claim 7, wherein the bit line pattern has third protrusions, having the same shape as the first and second protrusions, positioned repeatedly along the first and second lateral portions of the bit line pattern, and
wherein the cell structure further comprises:
third active regions corresponding to the third protrusions and arranged along the bit line pattern in the semiconductor substrate, the third active regions having the same shape as the first active region and being positioned vertically and horizontally with respect to the first and second active regions;
third gate patterns in the third active regions, the third gate patterns having the same shape as the first and second gate patterns; and
second landing pads located between the third gate patterns and contacting the third active regions to electrically connect the third active regions to the bit line pattern.

9. A cell structure of a semiconductor device, comprising:
a first active region in a semiconductor substrate, the first active region having a first concave portion;
a second active region in the semiconductor substrate, the second active region having a second concave portion;
an inactive region in the semiconductor substrate defining the first and second active regions;
a first gate pattern in the first active region, the first gate pattern being arranged perpendicular to the first active region;
a second gate pattern in the second active region, the second gate pattern being arranged perpendicular to the second active region;
a first landing pad on the first active region and the inactive region contacting the first active region;
a bit line pattern on the inactive region configured to intersect the first and second gate patterns perpendicularly, the bit line pattern being electrically connected to the first landing pad, wherein the bit line pattern has a first protrusion extending from a first lateral portion of the bit line pattern to overlap a lateral portion of the first active region, which is located opposite to the first concave portion of the first active region, and has a second protrusion extending from a second lateral portion of the bit line pattern into the second concave portion of the second active region; and
a bit line contact between the first landing pad and the bit line pattern, the bit line contact contacting the first landing pad and the bit line pattern on the first inactive region,
wherein the first concave portion of the first active region is in a selected lateral portion of the first active region, which overlaps a portion of the first gate pattern, and
wherein the first and second gate patterns are parallel to each other and extend across the first and second concave portions, and the first and second protrusions of the bit line pattern.

10. The cell structure according to claim 9, wherein the bit line pattern further has third protrusions, having the same shape as the first and second protrusions, positioned repeatedly along the first and second lateral portions of the bit line pattern, and
wherein the cell structure further comprises:
third active regions corresponding to the third protrusions and arranged along the bit line pattern in the semiconductor substrate, the third active regions having the same shape as the first active region and being positioned vertically and horizontally with respect to the first and second active regions;
third gate patterns in the third active regions, the third gate patterns having the same shape as the first and second gate patterns; and
second landing pads located between the third gate patterns and contacting the third active regions to electrically connect the third active regions to the bit line pattern.

11. A cell structure of a semiconductor device, comprising:
a first active region in a semiconductor substrate, the first active region having a first concave portion;
a second active region in the semiconductor substrate, the second active region having a second concave portion;
an inactive region in the semiconductor substrate defining the first and second active regions;
a first gate pattern arranged across the first and second active regions;
a first landing pad on the first active region and the inactive region contacting the first active region; and
a bit line pattern on the inactive region configured to intersect the first gate pattern perpendicularly, the bit line pattern being electrically connected to the first landing pad and having a protrusion extending into the second concave portion of the second active region.

* * * * *